US012317457B2

(12) United States Patent
Catuneanu et al.

(10) Patent No.: US 12,317,457 B2
(45) Date of Patent: May 27, 2025

(54) SYSTEMS FOR A HEAT EXCHANGER WITH A BIASING BRACKET AND MOUNTING PLATE

(71) Applicant: Dana Canada Corporation, Oakville (CA)

(72) Inventors: Andrei Catuneanu, Oakville (CA); Benjamin A. Kenney, Toronto (CA); Silvio Tonellato, Hamilton (CA); Jiangfeng Yu, Mississauga (CA)

(73) Assignee: DANA CANADA CORPORATION, Oakville (CA)

( * ) Notice: Subject to any disclaimer, the term of this patent is extended or adjusted under 35 U.S.C. 154(b) by 248 days.

(21) Appl. No.: 17/663,817

(22) Filed: May 17, 2022

(65) Prior Publication Data

US 2023/0380103 A1 Nov. 23, 2023

(51) Int. Cl.
| | |
|---|---|
| *H05K 7/20* | (2006.01) |
| *F28F 9/007* | (2006.01) |
| *H01L 23/40* | (2006.01) |
| *H01L 23/367* | (2006.01) |
| *H01L 23/473* | (2006.01) |

(52) U.S. Cl.
CPC ....... *H05K 7/20927* (2013.01); *F28F 9/0075* (2013.01); *H01L 23/4093* (2013.01); *H05K 7/20254* (2013.01); *H01L 23/3672* (2013.01); *H01L 23/40* (2013.01); *H01L 23/473* (2013.01); *H05K 7/2049* (2013.01)

(58) Field of Classification Search
CPC ........... H05K 7/20218; H05K 7/20254; H05K 7/2039; H05K 7/20436; H05K 7/20445; H05K 7/2049; H05K 7/20845; H05K 7/20854; H05K 7/2089; H05K 7/209; H05K 7/20927; F28F 9/007; F28F 9/0075; F28F 9/001
See application file for complete search history.

(56) References Cited

U.S. PATENT DOCUMENTS

| | | | | |
|---|---|---|---|---|
| 4,563,725 | A | * | 1/1986 | Kirby ..................... H05K 1/189 257/E23.09 |
| 6,043,981 | A | * | 3/2000 | Markow ............. H01L 23/4006 257/E23.084 |
| 7,206,204 | B2 | | 4/2007 | Nakatsu et al. |
| 8,582,291 | B2 | | 11/2013 | Nakasaka et al. |
| 8,885,344 | B2 | | 11/2014 | Asakura et al. |
| 10,600,721 | B2 | | 3/2020 | Machler et al. |
| 2011/0216507 | A1 | * | 9/2011 | Kadomoto ............... H05K 7/20 361/714 |

(Continued)

FOREIGN PATENT DOCUMENTS

JP 2016092349 A * 5/2016

*Primary Examiner* — Zachary Pape
*Assistant Examiner* — Steven Ngo
(74) *Attorney, Agent, or Firm* — McCoy Russell LLP

(57) ABSTRACT

Systems are provided for a power electronics cooling assembly. In one example, a system for a power electronics cooling assembly includes: a first cooling plate, a mounting plate, the mounting plate having mounting points to be attached to a housing, an electronic module disposed between the first cooling plate and the mounting plate, and a spring bracket applying force towards the first cooling plate, the spring bracket having mounting points aligned with the mounting points of the mounting plate.

17 Claims, 11 Drawing Sheets

(56) References Cited

U.S. PATENT DOCUMENTS

| | | | |
|---|---|---|---|
| 2015/0289411 A1* | 10/2015 | Kamiya | H05K 7/20263 |
| | | | 361/701 |
| 2015/0328993 A1* | 11/2015 | Shin | H05K 7/20927 |
| | | | 307/10.1 |
| 2016/0093788 A1 | 3/2016 | Matsumoto et al. | |
| 2016/0242313 A1* | 8/2016 | Singh | H05K 1/184 |
| 2016/0289411 A1* | 10/2016 | Bowman | C08J 9/141 |
| 2018/0166357 A1 | 6/2018 | Machler et al. | |
| 2020/0236805 A1* | 7/2020 | Lin | H05K 7/20409 |
| 2021/0243923 A1* | 8/2021 | Hwang | H05K 7/2029 |
| 2021/0337703 A1* | 10/2021 | Lee | H01L 23/473 |
| 2022/0018143 A1* | 1/2022 | Pennington | A47B 53/02 |
| 2022/0225547 A1* | 7/2022 | Müller | H05K 7/20872 |
| 2022/0369497 A1* | 11/2022 | Siewert | H01L 23/40 |
| 2024/0098848 A1* | 3/2024 | Kräck et al. | H05B 3/50 |
| 2024/0107720 A1* | 3/2024 | Rohl | H02J 7/0063 |

\* cited by examiner

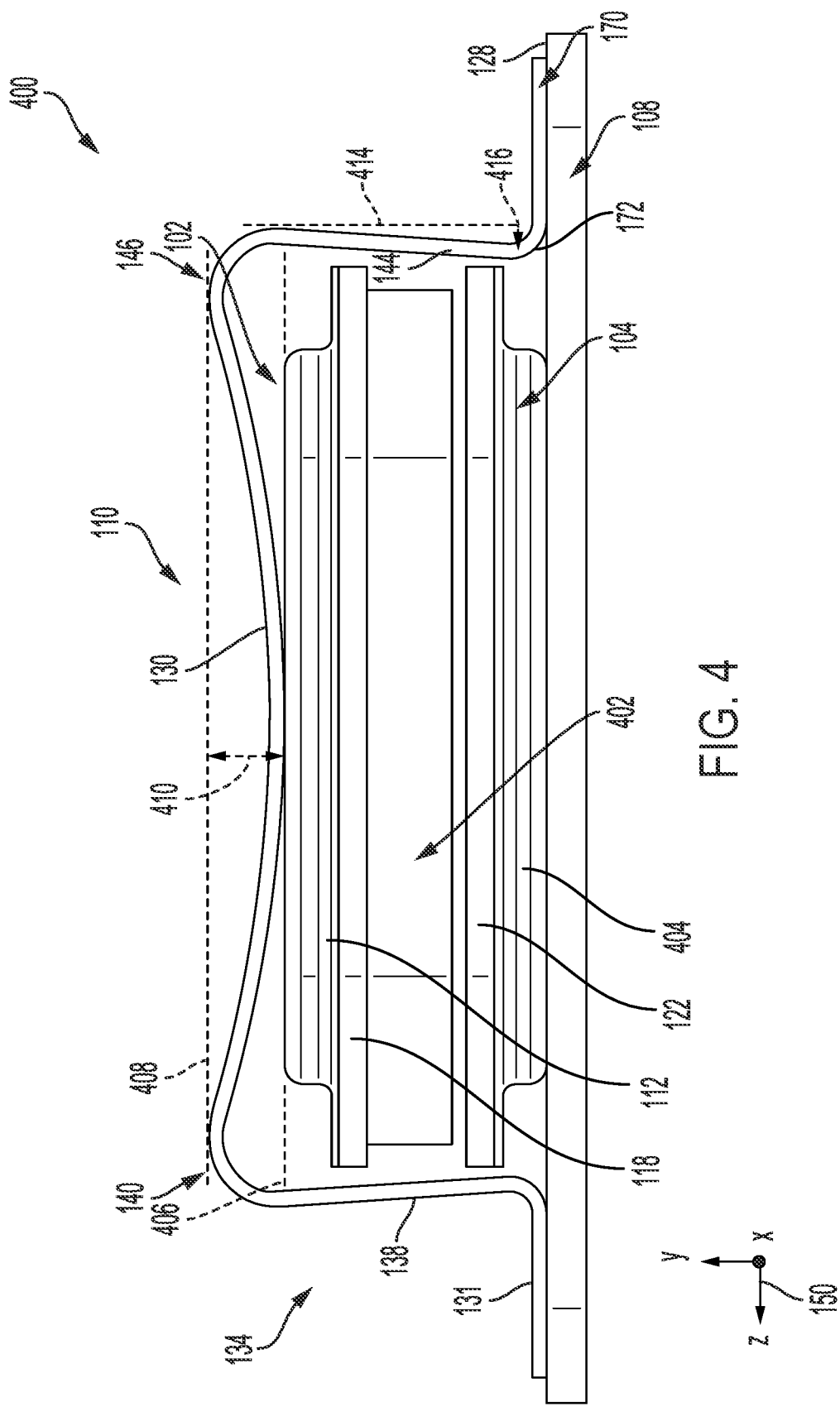

SYSTEMS FOR A HEAT EXCHANGER WITH A BIASING BRACKET AND MOUNTING PLATE

TECHNICAL FIELD

The present description relates generally to systems for mounting a heat exchanger onto electronic components.

BACKGROUND AND SUMMARY

Heat generating devices, such as power electronic devices, may be coupled to a heat exchanger to remove heat and lower the maximum operating temperature of the heat generating device. In some examples, the power electronic devices or modules are provided with opposite planar faces along which cooling can be effected. Such devices may be cooled by contacting one or both of the opposite planar faces of the device with a heat exchanger. In order to maximize thermal contact with the planar face of the power electronic device, the heat exchanger may have a planar surface along which it contacts the power electronic device, and a thin layer of thermal interface material (TIM) may be provided between the heat sink and the planar face of the power electronic device. In some examples, a cooling fluid such as air or a liquid coolant may be circulated along or within the heat exchanger.

In some examples, cooling assemblies for power electronics devices may include means for joining first and second heat exchangers to the opposite sides of a power electronics device in a sandwich arrangement. Contact between the power electronic device and the heat exchanger may be increased by compressing the first and second heat exchangers around the device. For example, such double-sided power electronics heat exchangers may have tabs between an inlet and outlet through fasteners such as clips or bolts may be attached for joining the heat exchangers. However, the power module dimensions must be known in order to space the fasteners appropriately to avoid interfering with the module or electronic leads. As such arrangements may require specific fastener patterns based on the dimensions of a power module, they are application specific.

In one example, the issues described above may be addressed by a power electronics cooling assembly, comprising: a first cooling plate; a mounting plate, the mounting plate having mounting points to be attached to a housing; an electronic module disposed between the first cooling plate and the mounting plate; and a spring bracket applying force towards the first cooling plate, the spring bracket having mounting points aligned with the mounting points of the mounting plate. In this way, effective compression between the heat exchanger and the electronics components is achieved.

In one example, the power electronics cooling assembly may include the spring bracket affixed over the first cooling plate and secured to the mounting plate via the mounting points of the mounting plate. In one example, the spring bracket may comprise an I-shaped bar having a first end region and an opposing, second end region. In some examples, the spring bracket may include a plurality of arms, the arms having a first segment bending approximately perpendicular to the I-shaped bar and a second segment bending parallel to the mounting plate. The second segment may have a through-hole aligned with the mounting points of the mounting plate. As another example, the spring bracket may include cylindrical cavities aligned with the mounting points of the mounting plate. In another example, the spring bracket may be stiff, substantially flat, and attached by springs to the mounting plate. In another example, the spring bracket may bend convexly towards the upper cooling plate. In another example, the spring bracket may have a central opening including a circumferential rib. In one example, the spring bracket may include two or more ribs. In another example, the bracket may include a plurality of flexible appendages in contact with the upper cooling plate. In some examples, the assembly may include a second cooling plate that may be arranged between the electronic module and the mounting plate for dual-sided cooling. In this way, a power electronics cooling assembly achieves flexible and secure compression of the captured components and increases cooling for modules of different dimensions.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 4 shows an in-line view of the power electronics cooling assembly shown in FIG. 1, particularly a profile of a spring bracket.

DETAILED DESCRIPTION

The following description relates to systems for a power electronics cooling assembly. The power electronics cooling assembly comprises a first cooling plate and an electronic module disposed between the first cooling plate, and one or more of a second cooling plate, a mounting plate, a spring bracket, and a mounting bracket. In one example, for dual-sided cooling, the assembly may include the spring bracket affixed to the mounting plate over the first cooling plate, the spring bracket applying force to compress the electronic module captured between the first cooling plate and the second cooling plate. In another example, for single-sided cooling, the assembly may include the spring bracket affixed to the mounting plate over the first cooling plate, the spring bracket applying force to compress the electronic module captured between the first cooling plate and the mounting plate. In some examples, the first cooling plate may be referred to as an upper cooling plate and the second cooling plate may be referred to as a lower cooling plate. In some examples, the spring bracket may include ribs such as for strengthening and/or controlling compressive force. Additionally or alternatively, the spring bracket may include a plurality of appendages such as for distributing compressive force and/or for joining components of the assembly. The assembly may mount to directly to existing mounting points of a housing of heat-producing electronics components (e.g., an inverter or other devices) reducing tabs and other electronic module dimension-specific mounting components. For example, the spring bracket may use orifices of the mounting plate in order to compress the assembly and to fasten the assembly to the housing of an inverter. In other examples, such as where a mounting plate may not be included, the assembly may include a mounting bracket with orifices for securing the assembly to a housing of an inverter. As one example, the mounting bracket may comprise a bracket upper plate and a bracket lower plate, the bracket upper plate affixed to the bracket lower plate over the first cooling plate and compressing the electronic module between the first cooling plate and the bracket lower plate. In another example, a second cooling plate may be included between the bracket lower plate and the electronic module. The assembly may be compatible with a variety of heat exchanger designs, simplifying the compression mechanism and increasing heat transfer capacity. The desired uniform pressure on the thermal interface material between the power module and the cooler may be achieved by choice of material, thickness of material, shape of the bracket, and any additional features incorporated into the bracket which will distribute the compressive force. In this way, the assembly may be compatible with and customizable to a variety of cooling applications.

Figure 1:
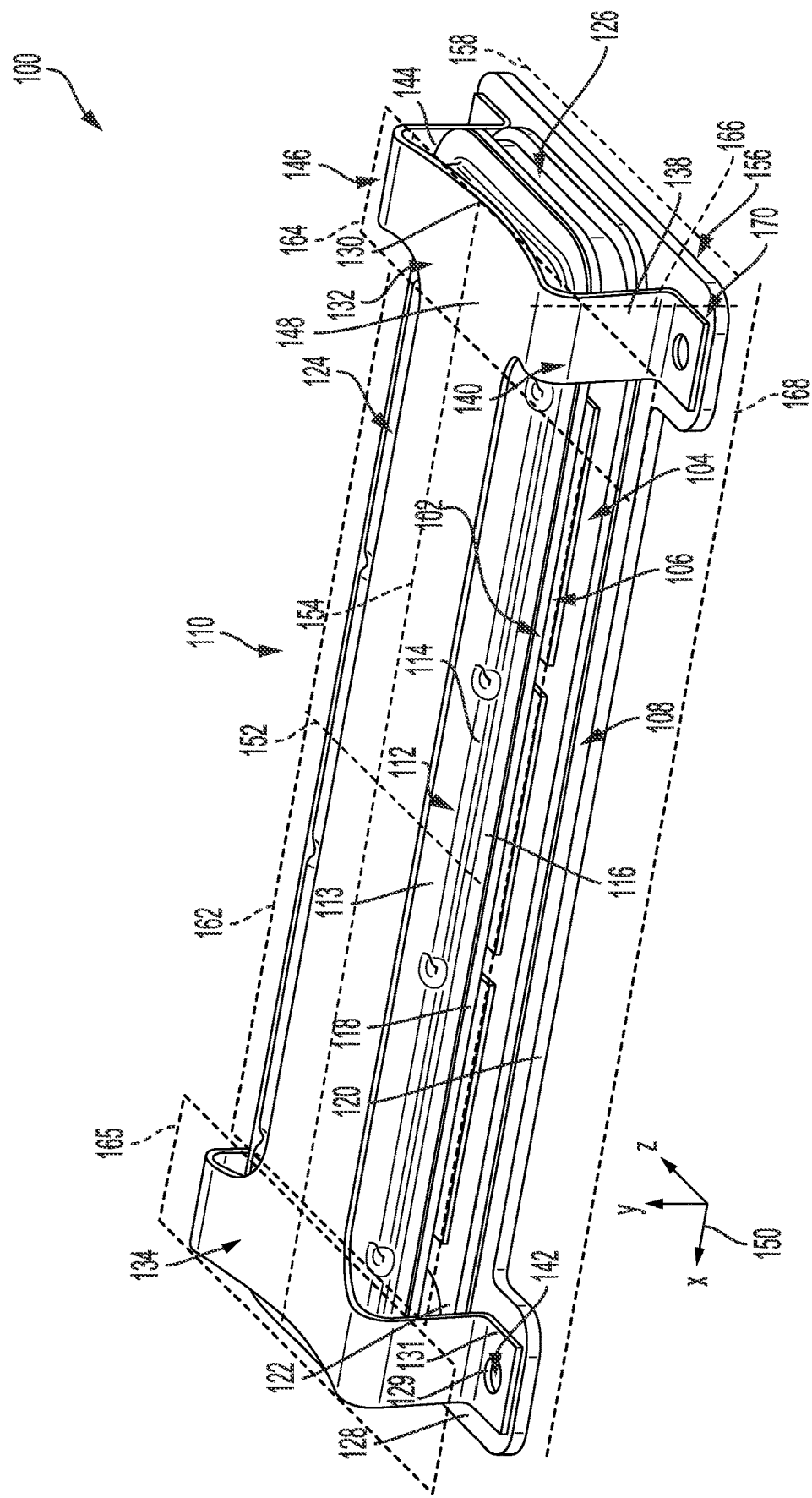
FIG. 1 shows a perspective view of a power electronics cooling assembly.
Figure 5A:
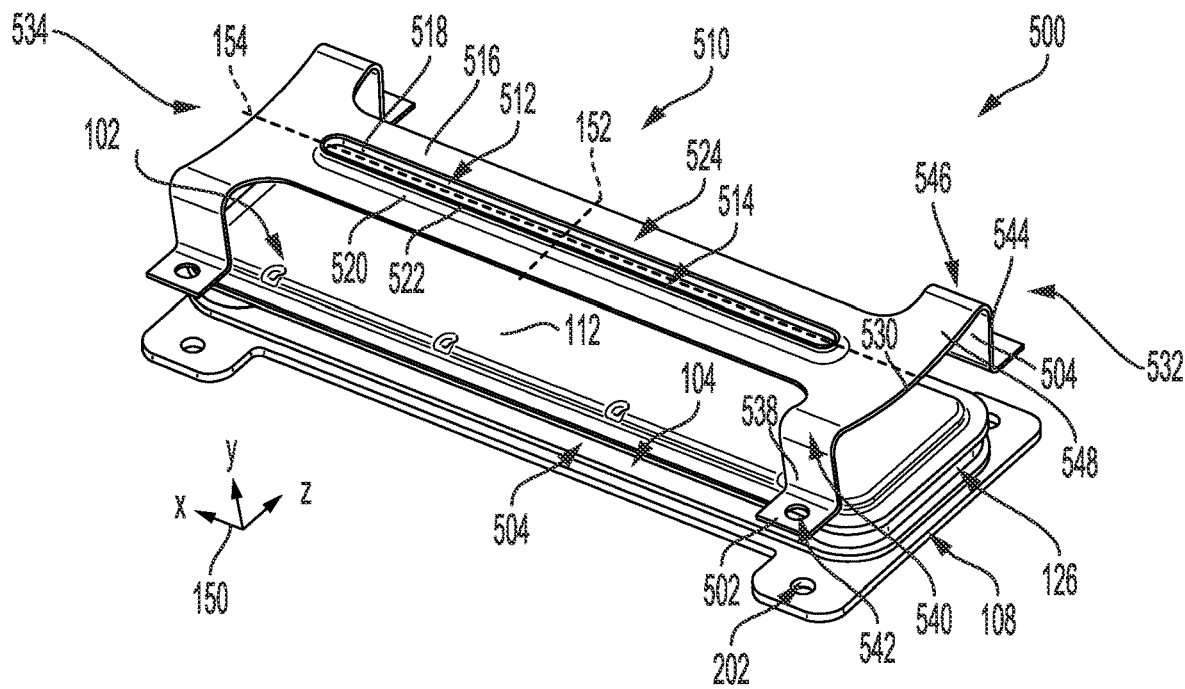
FIG. 5A shows a perspective view of a power electronics cooling assembly, particularly with the spring bracket removed.
Figure 5B:
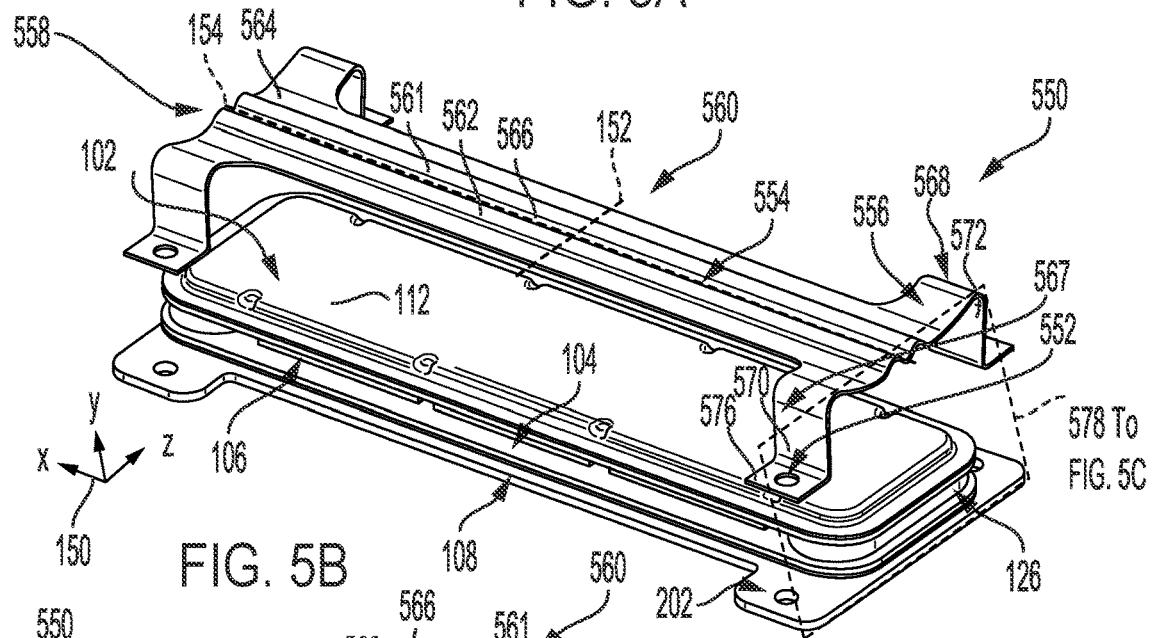
FIG. 5B shows a perspective view of a power electronics cooling assembly, particularly with the spring bracket removed.
Figure 5C:
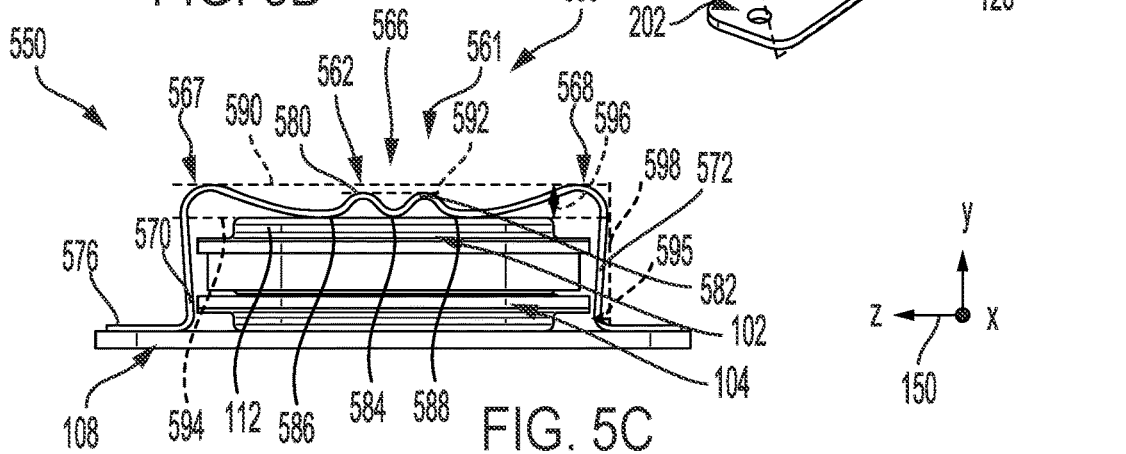
FIG. 5C shows an in-line view of the power electronics cooling assembly shown in FIG. 5B.
Figure 6:
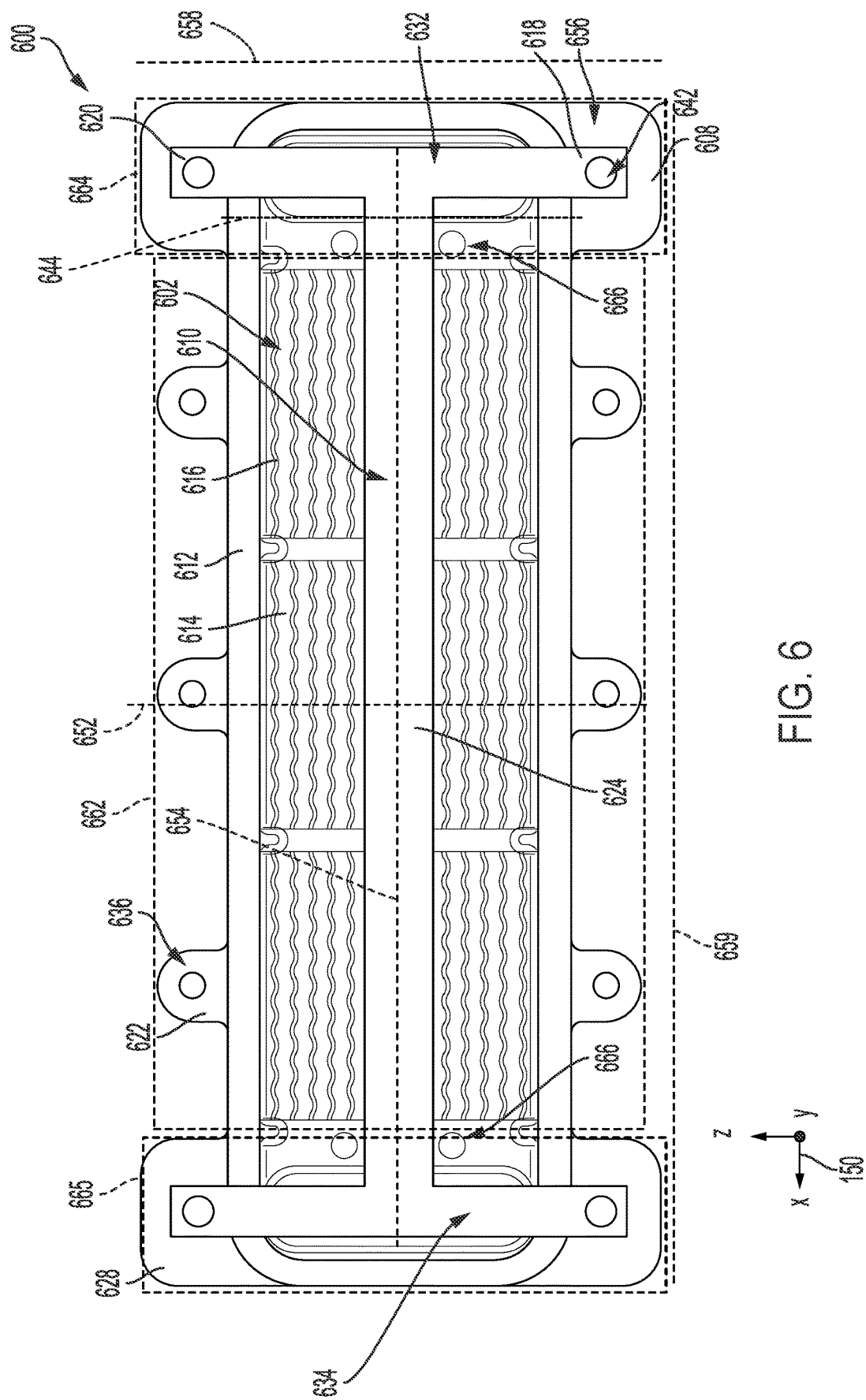
FIG. 6 shows a top view of a power electronics cooling assembly.
Figure 8:
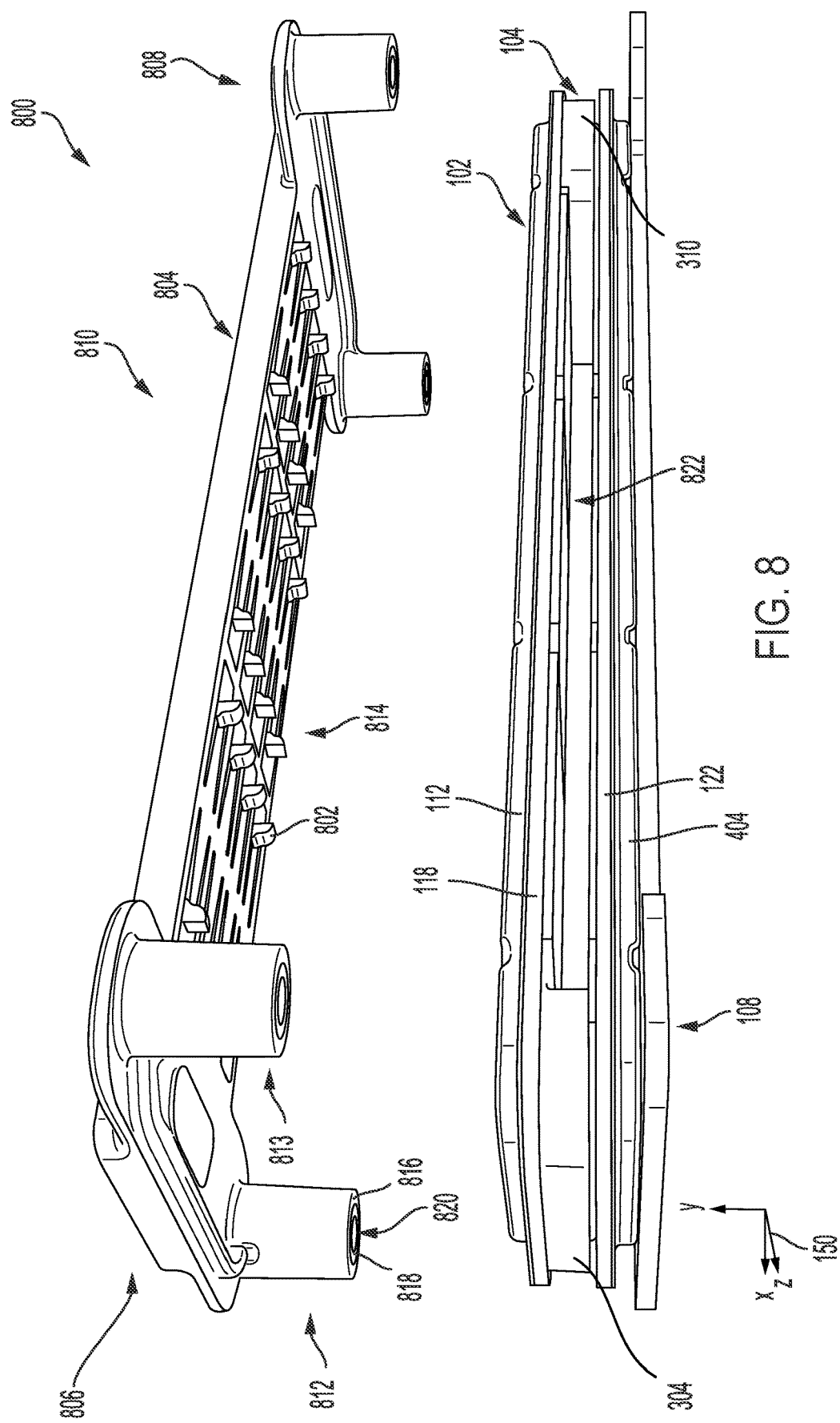
FIG. 8 shows a perspective view of a power electronics cooling assembly, particularly with the spring bracket removed.
Figure 9:
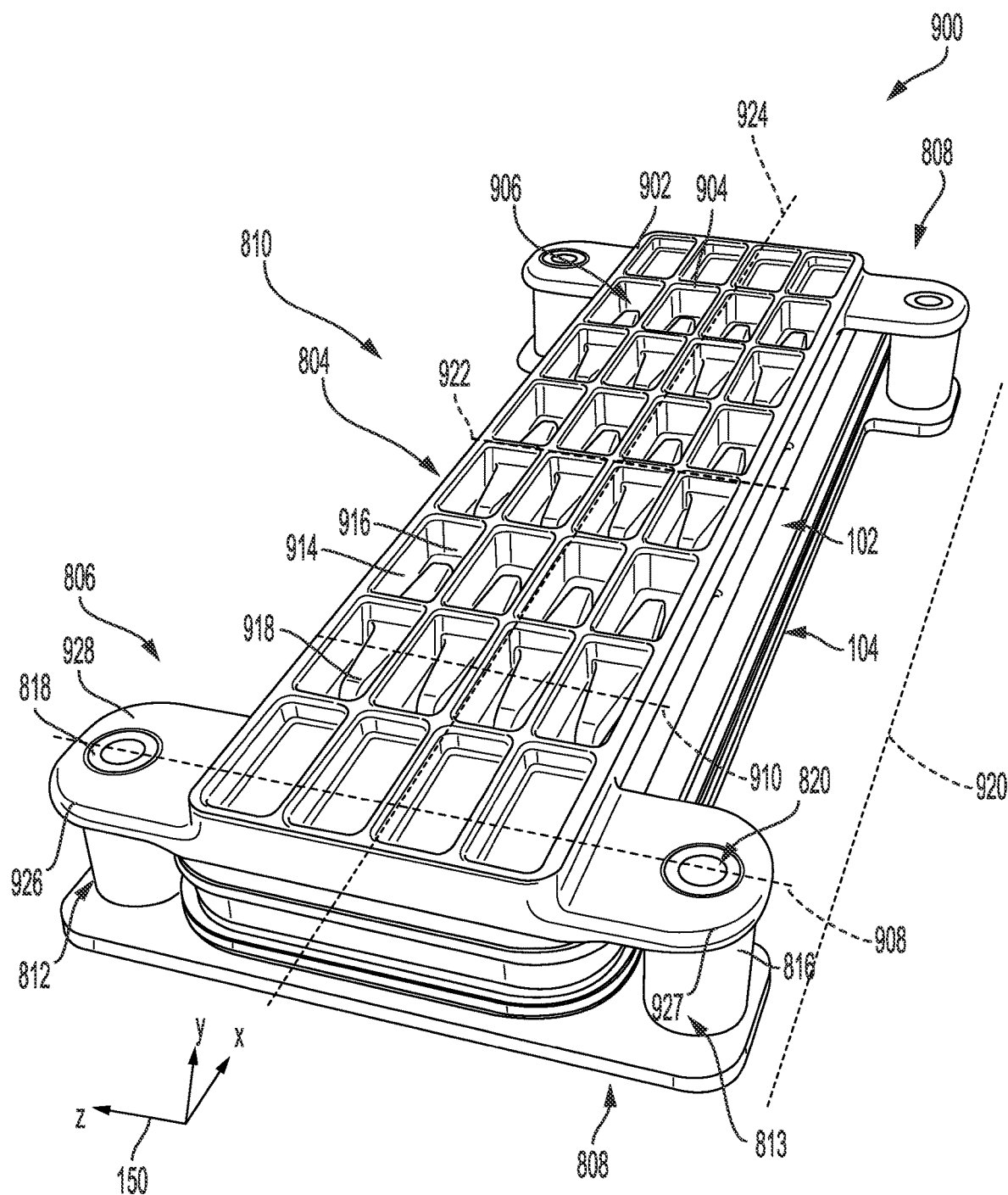
FIG. 9 shows a second perspective view of the power electronics cooling assembly shown in FIG. 8.
Figure 10:
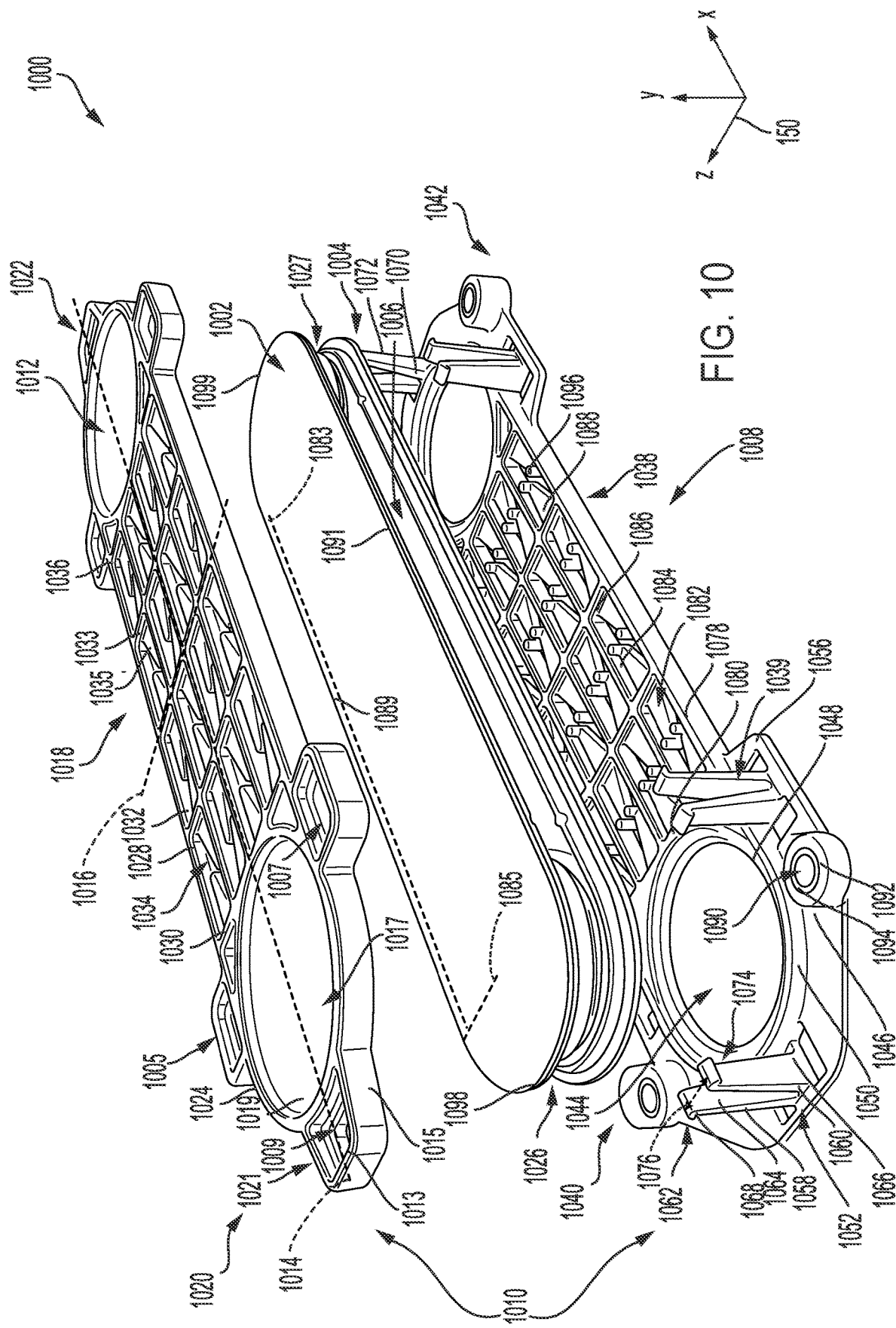
FIG. 10 shows a perspective view of a power electronics cooling assembly including a mounting bracket.
Figure 11:
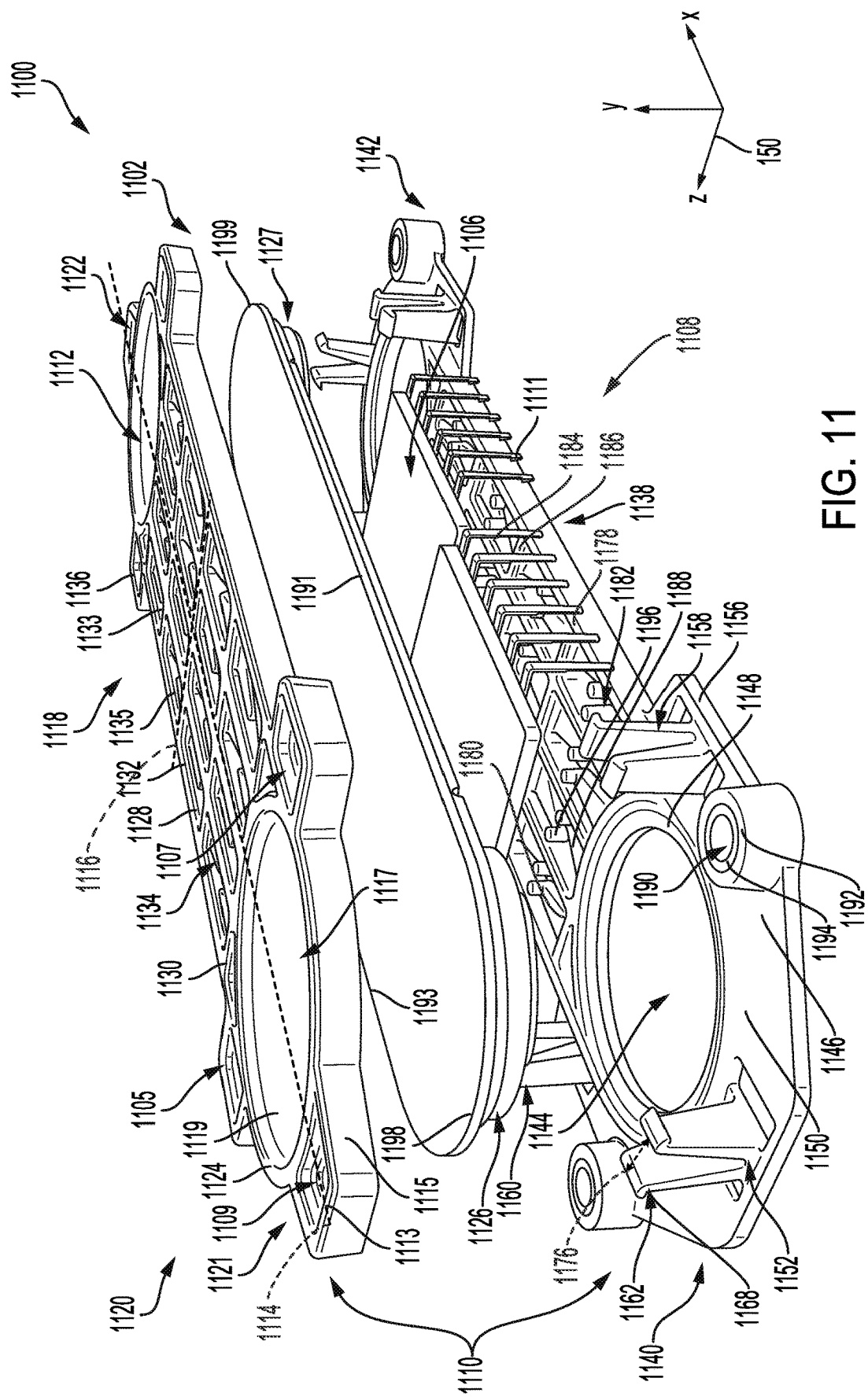
FIG. 11 shows a perspective view of a power electronics cooling assembly including a mounting bracket.

The figures depict one or more implementations in accord with the present teachings, by way of example only, not by way of limitation. A top view of the power electronics cooling assembly is shown in FIG. 1. The power electronics cooling assembly shown in FIG. 1 includes a spring bracket. The bracket is shown removed to illustrate assembly mounting points in FIG. 2. The upper cooling plate and module are shown in FIG. 3A. A bottom view illustrating the underside of the power electronics cooling assembly is shown in FIG. 3B. A view illustrating a profile of the assembly is shown in FIG. 4. Additional or alternative embodiments for the spring bracket including ribs are shown in FIGS. 5A, 5B, and 5C. A top view of a power electronics cooling assembly is shown in FIG. 6. The embodiment shown in FIG. 6 may include a bracket comprising a bar attached to a mounting plate by springs. The assembly including a bar attached to a mounting plate by springs is shown in more detail in FIG. 7. A power electronics cooling assembly including a plastic bracket is shown in FIG. 8 and FIG. 9. A power electronics cooling assembly including a mounting bracket is shown in FIG. 10. A power electronics cooling assembly for single-sided cooling applications including a mounting bracket is shown in FIG. 11. FIGS. 1-11 are shown approximately to scale.

In the illustrated example FIG. 1, a power electronics cooling assembly or assembly 100 is shown. The example shows a perspective view of power electronics cooling assembly 100 depicting a shape of the device that may be described as substantially flat and I-shaped. In one example, the shape of the assembly may be divided into a central region 162, a first end region 164, and a second end region 165. The first end region 164 and second end region 165 are located on opposite sides of the central region. Assembly 100 is substantially symmetrical across lateral line of symmetry 152 and across longitudinal line of symmetry 154. In one example, a height 166 of power electronics cooling assembly 100 may be less than a lateral width 158 at a widest point and the lateral width less than a longitudinal length 168. An axis system 150 is given in FIG. 1 and is given in each of the figures hereafter.

Assembly 100 may be configured for dual-sided cooling. Assembly 100 includes upper cooling plate 102 arranged parallel in the xz plane with a lower cooling plate 104, and electronic module 106 disposed therebetween. Mounting plate 108 is positioned adjacent an underside of the lower cooling plate 104. A spring bracket or spring bracket 110 is shown positioned over the top of upper cooling plate 102, electronic module 106, and lower cooling plate 104. When affixed to mounting plate 108, spring bracket 110 flexibly compresses the upper and lower cooling plate and electronic module captured therebetween.

Upper cooling plate 102 and lower cooling plate 104 may be described as substantially flat and rectangular. In one example, the upper cooling plate and the lower cooling plate are the same or similar. In one example, the upper cooling plate 102 may include an interior space for flowing fluid (e.g., coolant channel, coolant passage) enclosed within parallel plates, exterior-facing cover plate 112, and a module-facing upper base plate 118. The shape of cover plate 112 includes a top surface 113, a peripheral lip 116, and peripheral side surface 114 oriented approximately perpendicular to peripheral lip 116. The peripheral lip 116 is parallel in the xz plane with the top surface 113 of the cover plate 112. In one embodiment, lower cooling plate 104 may include a coolant channel enclosed within parallel plates, a mounting plate-facing underside plate (404 in FIG. 4), and a module-facing lower base plate 122. Gaskets 126 are shown installed between fittings (304, 310 in FIG. 3A) brazed to upper base plate 118 and the lower base plate 122 in the first end region 164 and in the second end region 165 of assembly 100. Upper cooling plate 102 and lower cooling plate 104 may be fluidically coupled to each other and to a coolant reservoir.

Mounting plate 108 may be described as substantially flat and I-shaped. Mounting plate 108 includes an upper surface 128 parallel with a lower surface (underside 354 in FIG. 3B) and a perpendicularly oriented side surface 120. Mounting plate 108 includes a plurality of flanges 156. In the example, a pair of flanges 156 are located opposite from each other in the first end region 164 and pair of flanges 156 are located opposite from each other in the second end region 165. Flanges 156 of the mounting plate 108 mate with bracket flanges 170 of spring bracket 110.

In one example, spring bracket 110 may be an I-shaped bar (e.g., in the xz plane) having a first end region and a second end region. In one example, spring bracket 110 may be formed from a single piece of metal. Spring bracket 110 includes bar 124, first end region or first end 132, and second end region or second end 134. First end 132 and second end 134 are symmetric (e.g., mirror each other) across line of symmetry 152. Spring bracket 110 may include a plurality of arms that include attachment points for affixing the spring bracket to the mounting plate. As one example, first end 132 includes central surface 148 extending outward along the z-axis from line of symmetry 154 to arms 140, 146. Arms 140, 146 curve downward along the y-axis to form to first segments 138, 144, the first segments bending approximately perpendicular to bar 124. Arms 140, 146 curve outward along the z-axis into a second segment herein referred to as bracket flanges 170, the bracket flanges 170 bending approximately parallel to the mounting plate. Bracket flanges 170 each have a through-hole 142 that may be defined by an opening on an exterior surface 131, an opening on an underside (not shown), and an inner cylindrical surface 129. Each through-hole 142 may align with a through-hole (202 in FIG. 2) of the mounting plate 108. The inner cylindrical surface 129 of through-hole 142 may be threaded for use with threaded fasteners such as screws, bolts, etc. Alternatively, other fasteners such as clamps may be used. Arm 146 is shaped similarly. An example profile view illustrating arm shape is detailed in FIG. 4.

When assembled in the system, the cover plate 112 of upper cooling plate 102 makes face sharing contact with an underside 172 of the spring bracket 110. Particularly, a convex biasing portion 130 of the underside 172 of the spring bracket 110 makes contact with the top surface 113 of the cover plate 112 across the longitudinal length 168 of the assembly. The mounting plate 108 makes face sharing contact with the spring bracket 110 where the underside 172 of bracket flanges 170 meet the upper surface 128 of flanges 156.

Figure 2:
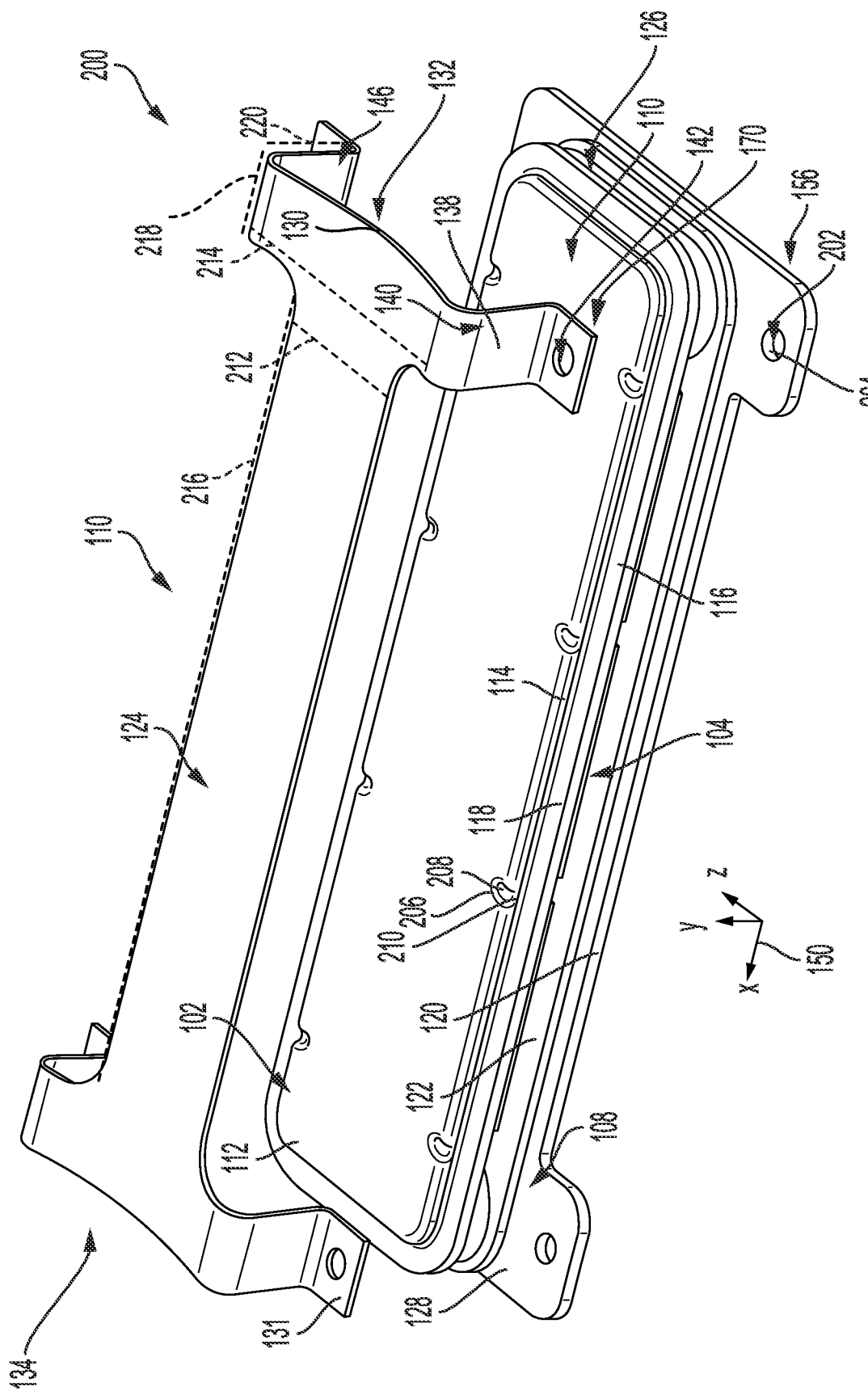
FIG. 2 shows a second view of the power electronics cooling assembly shown in FIG. 1, particularly with the spring bracket removed.
Figure 3A:
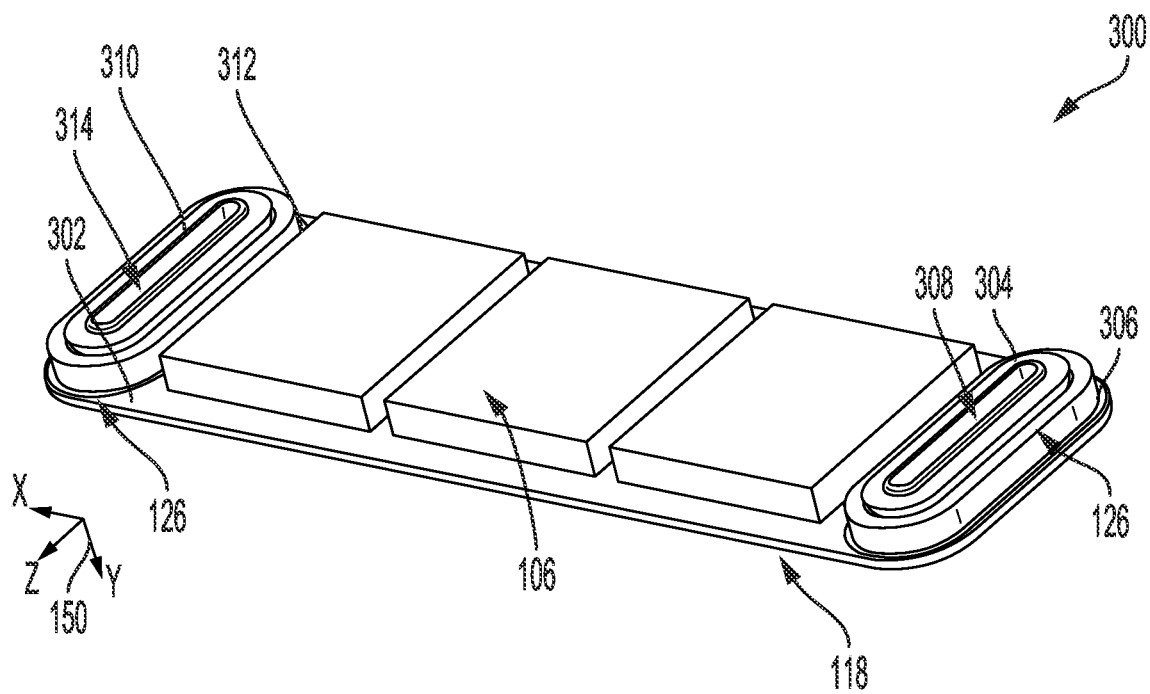
FIG. 3A shows a view of components of the power electronics cooling assembly shown in FIG. 1.
Figure 3B:
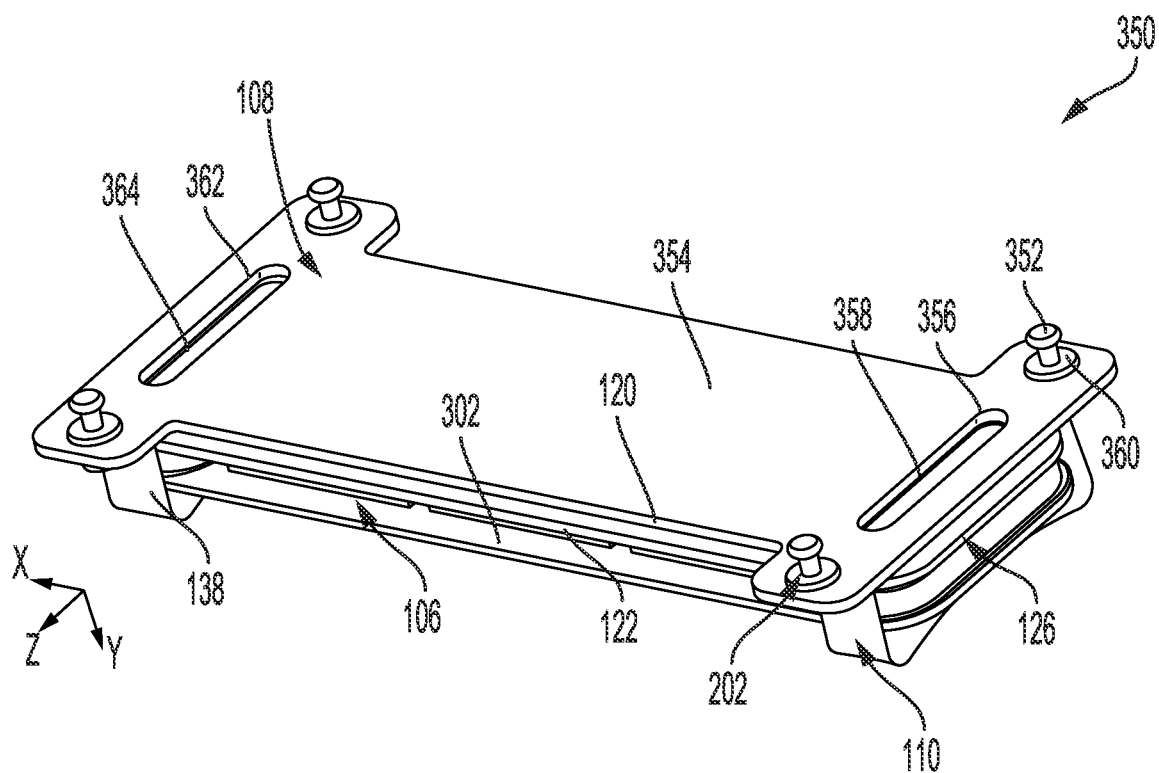
FIG. 3B shows a bottom view of the power electronics cooling assembly shown in FIG. 1.

FIG. 2 shows a perspective view of a power electronics cooling assembly or assembly 200. Assembly 200 may be the same or similar to assembly 100 of FIG. 1. Components of assembly 200 that are identical to components of assembly 100 are numbered the same and will not be introduced.

Assembly 200 is shown with spring bracket 110 removed. A plurality of through-holes 202 in flanges 156 of mounting plate 108 are visible. Through-holes 202 may defined by an opening in the upper surface 128, and the underside (354 in FIG. 3B) of flanges 156 and an inner cylindrical surface 204. The inner cylindrical surface 204 may be threaded for fasteners such as screws or bolts. In one example, the plurality of through-holes 202 of the mounting plate 108 may be used to mount the cooler to an inverter. Through-holes 142 of the bracket flanges 170 align with the through-holes 202 of the mounting plate 108. In one example, fasteners (e.g., screws, bolts) may be inserted through through-holes 142 for joining the spring bracket 110 with the mounting plate 108 and for affixing the assembly 100 to an inverter housing.

A plurality of notches 206 in the cover plate 112 of upper cooling plate 102 are shown. Notches 206 may be described half cylindrical recession 208 in the edge 210 between the top surface 113 and peripheral side surface 114 of cover plate 112.

Dimensions are indicated in dashed lines to further illustrate the relative shape of the spring bracket 110. Parallel with the z-axis, width 212 of the bar 124 portion of spring bracket 110 is approximately half as wide as length 214 of the first end 132 and the second end 134. Parallel with the x axis, length 216 of bar 124 is approximately 3.5 times longer than width 218 of the first end 132 and second end 134. Along the y-axis, height 220 of the spring bracket 110 is approximately the same length as width 218.

FIG. 3A illustrates an example 300 for a power electronics cooling assembly such as assembly 100 and assembly 200 shown in FIG. 1 and FIG. 2, respectively. Components of example 300 that are identical to components of assembly 100 are numbered the same and will not be introduced.

FIG. 3A shows the upper base plate 118 and electronic module 106. Electronic module 106 may be affixed to the surface 302 of upper base plate 118 in various ways such as through direct bonding (e.g., soldering, sintering). Such an example may have advantages such as reduced thermal resistance and overall increased thermal performance. Fittings 304, 310 may be brazed to the surface 302 of upper base plate 118 and lower base plate (122 in FIG. 1). Fittings 304, 310 may include recesses 308, 314 fluidically coupling coolant channels of the upper cooling plate 102 to a coolant reservoir. The lower cooling plate may be similarly constructed, coupled to a coolant reservoir and to the upper cooling plate 102. Gaskets 126 are seated in grooves 306, 312 surrounding fittings 304, 310. In one example, in the assembly (e.g., assembly 100, 200) gaskets 126 are compressed between the upper base plate 118 and the lower base plate.

FIG. 3B illustrates a perspective view of a power electronics cooling assembly or assembly 350. Assembly 350 may be the same or similar to the embodiments in FIG. 1, FIG. 2, and FIG. 3A. Components of assembly 350 that are identical to components of assembly 100, assembly 200, and embodiment 300 are numbered the same and will not be introduced.

As indicated by axis system 150, assembly 350 is rotated along the y-axis to show an underside 354 of mounting plate 108. Assembly 350 is shown with fasteners 352 inserted through washers 360 to join spring bracket 110 with the mounting plate 108. Fasteners 352 may be driven from the top surface, through spring bracket 110 and then through the mounting plate 108. In one example, fasteners 352 may join assembly 350 to a housing of an inverter. Joining the spring bracket 110 with the mounting plate 108 compresses the electronic module 106 between upper base plate 118 of the upper cooling plate and lower base plate 122 of the lower cooling plate. Compression may increase the capacity for heat transfer and cooling of electronic module captured between the upper cooling plate and the lower cooling plate.

Mounting plate 108 includes a pair of cutouts or first cutout 356 and second cutout 362, each defined by an opening on the underside 354, an opening on the upper surface (128 in FIG. 1), and inner surfaces 358, 364. In one example, the pair of cutouts may align with fittings. As one example, tubing may fluidically couple assembly 350 to a coolant reservoir via first cutout 356 and second cutout 362 using fittings 304, 310. In one example, coolant may enter the assembly through the first cutout 356 and pressurizingly pass through the upper cooling plate and lower cooling plate exchanging heat with electronic module 106 sandwiched therebetween. After the coolant passes the electronic module, the coolant exits via second cutout 362.

FIG. 4 shows a view of the power electronics cooling assembly or assembly 400 looking down the x-axis, indicated in axis system 150. Assembly 400 may be the same or similar to the embodiments in FIG. 1, FIG. 2, FIGS. 3A, and 3B. Components of assembly 400 that are identical to components of assembly 100, assembly 200, embodiment 300, and assembly 350 are numbered the same and will not be introduced.

In the view, spring bracket 110 is affixed over upper cooling plate 102 and lower cooling plate 104 compressing first gasket 402. Specifically, first gasket 402 makes face sharing contact with the upper base plate 118 and lower base plate 122 to pressurizingly seal coolant channels within the upper cooling plate 102 and lower cooling plate 104. Cover plate 404 of lower cooling plate 104 makes face sharing contact with the upper surface 128 of mounting plate 108. Cover plate 112 makes face sharing contact with the underside 172 of the spring bracket 110.

Dashed lines are included to further illustrate shape and contact surfaces of spring bracket 110 and assembly 400. Line 406 is drawn along the contact surface of underside 172 between the convex biasing portion 130 of the spring bracket 110 and the cover plate 112 of the upper cooling plate 102. Line 408 is drawn along the highest point of the arms 140, 146 and the exterior surface 131 of spring bracket 110. In one example, spring bracket 110 may bend or spring back along line 410, for example, to compress components captured under the spring bracket and to accommodate cooling plates and electronic modules of varying thickness. Line 414 is drawn parallel with the y-axis along the first segment 144 to one of bracket flanges 170 of arm 146. First segment 144 bends slightly inward from line 414, securing the captured plates laterally, as indicated by line 416. The bend of arm 140 mirrors the bend of arm 146. In one example, spring bracket 110 may bend or spring back along line 416 to accommodate various designs for cooling plates, electronic modules, and/or mounting plates.

FIG. 5A shows a power electronics cooling assembly or assembly 500. Particularly, assembly 500 includes an additional or alternative embodiment for a spring bracket or spring bracket 510. In one example, apart from spring bracket 510, assembly 500 may be configured similar to the embodiments for a power electronics cooling assembly depicted in FIGS. 1-4. Components of assembly 500 that are identical to components of assemblies introduced above are numbered the same and will not be introduced.

Assembly 500 includes upper cooling plate 102 and lower cooling plate 104, and gaskets 126 and an electronic module (e.g., 106 in FIGS. 1-4) captured therebetween. Similar to the embodiments described above, spring bracket 510 may be mounted over upper cooling plate 102, lower cooling plate 104, and the electronic module, and secured to mounting plate 108. In one example, fasteners may be inserted through through-holes 542 in spring bracket 510 that align with through-holes 202 in mounting plate 108. The fasteners may both compress the components contained between the spring bracket 510 and mounting plate 108 and secure assembly 500 to a housing of an inverter. Similar to the embodiments described above, assembly 500 is symmetric along line of symmetry 152 and line of symmetry 154.

In one example, spring bracket 510 may be a single, I-shaped piece of metal including bar 524 and a pair of opposite oriented ends including a first end region, or first end 532, and an opposing, second end region, or second end 534. First end 532 includes central surface 548 extending outward along the z-axis from line of symmetry 154 to arms 540, 546. Arms 540, 546 curve downward along the y-axis to form to first segments 538, 544. First segments 538, 544, are approximately perpendicular to bar 524. Arm 540 curves approximately 90 degrees into a second segment herein referred to as one of bracket flanges 502. The shape of arm 546 mirrors the shape of arm 540. The shape of second end 534 (e.g., arms, flanges, etc.) mirrors the shape of first end 532.

Spring bracket 510 includes a central opening 512 defined by an opening on the exterior surface 516, an opening on the underside 504, and a rib interior surface 518. Spring bracket 510 further includes a circumferential rib 514. Circumferential rib 514 includes an upper portion 522 oriented perpendicularly to the exterior surface 516 and a lower portion 520 that slopes into the exterior surface 516. In one example, circumferential rib 514 strengthens spring bracket 510, particularly along convex biasing portion 530, where the bracket touches the upper cooling plate 102 and compresses components captured between the bracket and mounting plate 108. Additionally, a spring bracket embodiment incorporating one or more ribs may enable control of force distribution over the electronic module.

FIG. 5B shows a power electronics cooling assembly or assembly 550. Particularly, assembly 550 includes an additional or alternative embodiment for a spring bracket or spring bracket 560. In one example, apart from spring bracket 560, assembly 550 may be configured similar to the embodiments for a power electronics cooling assembly depicted in FIGS. 1-4. Components of assembly 550 that are identical to components of assemblies introduced above are numbered the same and will not be introduced.

Assembly 550 includes upper cooling plate 102 and lower cooling plate 104, and gaskets 126 and electronic module 106 captured therebetween. Similar to the embodiments described above, spring bracket 560 may be mounted over upper cooling plate 102, lower cooling plate 104, and electronic module 106, and secured to mounting plate 108. In one example, fasteners may be inserted through through-holes 552 in spring bracket 560 that align with through-holes 202 in mounting plate 108. The fasteners may both compress the components contained between the spring bracket 560 and mounting plate 108 and secure assembly 550 to a housing of an inverter. Similar to the embodiments described above, assembly 550 is symmetric along line of symmetry 152 and line of symmetry 154.

In one embodiment, spring bracket 560 may be a single, I-shaped metal piece including bar 554 and a pair of opposite oriented ends, first end 556 and second end 558. Parallel with line of symmetry 154, a pair ribs, or first rib 561 and second rib 562, are formed along the upper surface 564 of spring bracket 560. A center trough 566 aligned with line of symmetry 154 is formed between first rib 561 and second rib 562. Arms 567, 568 curve downward along the y-axis to form to first segments 570, 572. First segments 570, 572, are approximately perpendicular to bar 554. Arm 567 curves approximately 90 degrees into one of a plurality of bracket flanges 576. The shape of arm 568 mirrors the shape of arm 567. The shape of second end 558 (e.g., arms, flanges, etc.) mirrors the shape of first end 556. Dashed lines 578 are drawn around a portion of first end 556. The portion is shown in more detail in FIG. 5C. Spring bracket 560 is shown with two ribs separated by a single trough. In other examples, a spring bracket may include a plurality of ribs, such as two or more ribs, separated by a plurality of troughs, such as two or more troughs.

FIG. 5C shows a view of assembly 550 illustrating a profile of spring bracket 560 looking down the x axis. Components of assembly 550 that are identical to components of the assemblies introduced above are numbered the same and will not be introduced. The view of assembly 550 shows the curvature of spring bracket 560 including first rib 561, second rib 562, and center trough 566. The curvature further includes on either side of the ribs first convex bend 586 and second convex bend 588. Similar to the embodiments for a spring bracket described above, arms 567, 568 curve inward somewhat from exactly perpendicular, as indicated by line 598. Line 598 is drawn parallel with the y-axis along the arm 568 to one of bracket flanges 576. First segment 572 bends slightly inward from line 598, securing the captured plates laterally, as indicated by arrow 595.

Dashed lines are included to further illustrate shape and contact surfaces of spring bracket 560 and assembly 500. Line 594 indicates contact surfaces between upper cooling plate 102 and spring bracket 560. In particular, under surface 584 of spring bracket 560 makes face sharing contact with cover plate 112 along center trough 566, first convex bend 586, and second convex bend 588. Line 590 indicates the highest point of arms 567, 568. Line 592 is drawn parallel with a top 582 of the curve of first rib 561 and a top 580 of the curve of second rib 562. Curves of first rib 561 and second rib 562 are lower than the highest point of the arms. When assembled in a power electronics cooling assembly, spring bracket 560 may bias upward and/or downward, as indicated by arrow 596, to flexibly compress assembly configurations (e.g., electronic module, cooling plates) of variable thickness captured between the bracket and mounting plate 108. Additionally, bracket embodiments including ribs, such as first rib 561 and second rib 562, may strengthen the spring bracket, particularly where the bracket touches the upper cooling plate 102.

In the illustrated example FIG. 6, a power electronics cooling assembly or assembly 600 is shown. Assembly 600 is illustrated looking into the y-axis, as shown in axis system 150. Assembly 600 may include a spring bracket comprising a bar attached to a mounting plate by springs. As one example, the spring bracket may be a stiff bar stamped from metal. The choice of material (e.g., type of metal) and thickness of material may be selected based on the compressive force desired. For example, the bar may be stamped from a stiff metal (e.g., more stiff than the springs) or a more flexible metal based on the application. As one example, the bar may be stamped from spring steel or stiff alloys of aluminum. As one example, the bar may include thicknesses up to 2 mm, depending on the force required to achieve bond line thickness of thermal interface materials. As another example, the bar may be stamped from a plastic or plastic-composite material such as glass-filled nylon composite.

Assembly 600 includes upper cooling plate 602 arranged in parallel in the xz plane with a lower cooling plate (704 in FIG. 7), and an electronic module (706 in FIG. 7) disposed between the upper and lower cooling plates. Assembly 600 further includes mounting plate 608 positioned adjacent to an underside of the lower cooling plate and a spring bracket or bracket 610 installed over the top of the upper cooling plate 602. Bracket 610 may be affixed to mounting plate 608 by springs (702 in FIG. 7). When affixed to mounting plate 608, bracket 610 distributes compressive force across upper cooling plate 602, the lower cooling plate, and electronic module captured therebetween. In one example, assembly 600 may be mounted to a housing of an inverter by mounting points in the mounting plate 608, referred to herein as through-holes 642.

Assembly 600 is substantially symmetrical across lateral line of symmetry 652 and across longitudinal line of symmetry 654. Assembly 600 is substantially I-shaped with a central region 662 capped on opposite ends by a first end region or first end 664, and an opposing, second end region or second end 665, similar to the above described assemblies. Assembly 600 further includes cooling plates (e.g., upper cooling plate 602, lower cooling plate 704) having a plurality of appendages or tabs 636 protruding from the periphery of the upper base plate 622 and the lower base plate (712 in FIG. 7). In one example, a lateral width 644 of assembly 600 in the central region 662 (e.g., excluding tabs) may be less than a lateral width 658 at a widest point and the lateral width less than a longitudinal length 659. An advantage of bracket 610 is by affixing over the top of the cooling components and mounting via springs in the first end 664 and second end 665, the assembly may accommodate cooling plates having tabs or other appendages.

Upper cooling plate 602 may be described as substantially flat and substantially rectangular (excluding tabs 636). In one embodiment, the lower cooling plate (704 in FIG. 7) may be the same or similar to upper cooling plate 602, and the cooling plates (e.g., 602, 704) in assembly 600 may be the same or similar to the cooling plates described above with respect the embodiments shown in FIGS. 1-5. In one example, upper cooling plate 602 may include an interior space enclosed within parallel plates, exterior-facing cover plate 612, and a module-facing upper base plate 622, for heat-exchanging fluid such as coolant. In the figure, cover plate 612 is transparent to show wavy fins 616 and passages 614 therebetween within the interior space. In one example, wavy fins 616 increase the heat exchanging capacity of coolant circulating through the cooling plates.

Mounting plate 608 may be described as substantially flat and I-shaped. Mounting plate 608 includes an upper surface 628 parallel with a lower surface (not shown). Mounting plate 608 includes a plurality of flanges 656. In the example, a pair of flanges 656 are located opposite from each other in the first end 664 and pair of flanges 656 are located opposite from each other in the second end 665. In one example, flanges 656 include mounting points (e.g., through-holes 708 in FIG. 7) for attaching assembly 600 to an inverter housing.

In one example, bracket 610 may be a one-piece, planar, I-shaped piece. In one example, bracket 610 may be brazed to upper cooling plate 602. In other examples, the bracket may be simply placed on top of the upper cooling plate. In another example, the upper cooling plate 602 may include brazed locating features 666 for indicating spring bracket placement. Bracket 610 includes a bar 624 in central region 662 and a pair of opposite oriented ends, first end region or first end 632, and second end region or second end 634. First end 632 and second end 634 are symmetric (e.g., mirror each other) across line of symmetry 652. First end 632 includes first arm 618 extending outward along the z-axis from line of symmetry 654 and a second arm 620 symmetric along the z-axis with the first arm. First arm 618 and second arm 620 are oriented at opposite, approximately 90 degree angles from bar 624 in the xz plane. Each arm includes one of a plurality of through-holes 642. In the example of assembly 600, there are four arms and four through-holes. By attaching springs to through-holes 642 and to the aligning through-holes of the mounting plate, compressive force may be applied to the plates and electronic module captured between bracket 610 and mounting plate 608.

Figure 7:
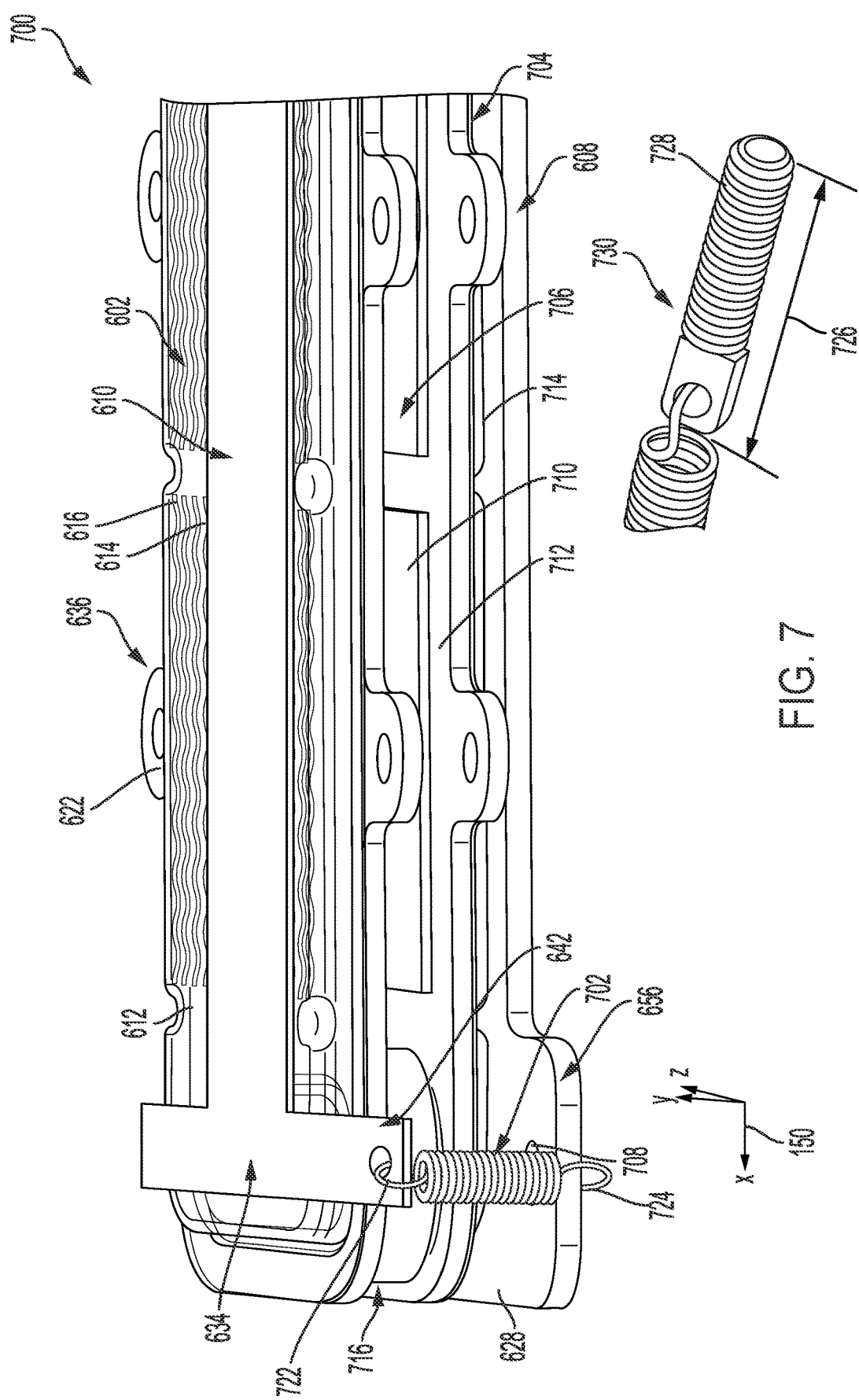
FIG. 7 shows a perspective view of the power electronics cooling assembly shown in FIG. 6.

A side view of an embodiment for a power electronics cooling assembly or assembly 700 is shown in FIG. 7. Assembly 700 may be the same or similar to assembly 600 of FIG. 6. Components of assembly 700 that are identical to components of assembly 600 are numbered the same and will not be introduced.

Assembly 700 shows bracket 610 attached by springs 702 to mounting plate 608. First end 722 of springs 702 may attach to one of through-holes 642 in bracket 610. Second end 724 of springs 702 may attach to one of through-holes 708 in mounting plate 608. As one example, springs 702 may include an anchor 726. Anchor 726 may be adjusted to control tension during assembly. In one example, threads 728 on the shank 730 of the anchor component may match with threads on an inner cylindrical surface one of through-holes in a mounting plate (not shown). The anchor 726 may be twisted to increase or decrease compression. In another example, anchor 726 may be used to secure assembly 600 to a housing of an inverter.

Assembly 700 shows the arrangement of assembly components compressed between bracket 610 and mounting plate 608. Electronic module 706 is sandwiched between upper cooling plate 602 and lower cooling plate 704. Upper cooling plate 602 and lower cooling plate 704 are sandwiched between bracket 610 and mounting plate 608. When assembled in the system, cover plate 612 of upper cooling plate 602 makes face sharing contact with an underside (not shown) of bracket 610. An underside (not shown) of upper base plate 622 makes face sharing contact with surface 710 of electronic module 706. Lower base plate 712 makes face sharing contact with a surface (not shown) of electronic module 706. Mounting plate 608 makes face sharing contact with cover plate 714 of lower cooling plate 704. Similar to the embodiments described above, gaskets 716 for fittings (e.g., 310 in FIG. 3A) may be compressed between the upper cooling plate 602 and lower cooling plate 704.

In the illustrated example FIG. 8, a power electronics cooling assembly or assembly 800 is shown. Assembly 800 includes a spring bracket or plastic spring bracket 810 formed with compression features including a plurality of flexible appendages or compression fingers 802 for exerting compressive force on plates captured in the assembly 800. In one example, apart from plastic spring bracket 810, assembly 800 may be configured similar to the embodiments for a power electronics cooling assembly depicted in FIGS. 1-4. Components of assembly 800 that are identical to components of the assemblies illustrated with respect to FIGS. 1-4 are numbered the same and will not be introduced.

Assembly 800 includes upper cooling plate 102 arrange parallel in the xz plane with a lower cooling plate 104, and a space 822 disposed between the upper and lower cooling plates for an electronic module (e.g., 106 in FIG. 1). Assembly 800 further includes mounting plate 108 positioned adjacent an underside of the lower cooling plate. Assembled in a system, plastic spring bracket 810 may be installed over the top of the upper cooling plate 102 and affixed to mounting plate 108. First and second fittings or fittings 304, 310 may couple interior channels of the upper cooling plate 102 and lower cooling plate 104 to a coolant reservoir.

Plastic spring bracket 810 may be formed from single molded piece of plastic. In one example, plastic spring bracket 810 is I-shaped (e.g., in the xz plane) including a central bar 804, a first end region or first end 806, and an opposing, second end region or second end 808. Central bar 804 is substantially planar. First end 806 and second end 808 are located on opposite ends of central bar 804. First end 806 includes a first cylindrical projection 812 and second cylindrical projection 813. Second end 808 includes a pair of cylindrical projections mirroring those on the first end 806. First cylindrical projection 812 may be described as a molded cylinder oriented approximately perpendicular to central bar 804. In other words, the cylindrical projections may be described as projecting along a xy plane from an underside 814 of plastic spring bracket 810. In one example, first cylindrical projection 812 may include cylindrical cavity 820 defined by an opening on the lower surface 816 of the first cylindrical projection 812, an opening on the upper surface (928 in FIG. 9) and an inner cylindrical surface (not shown). In one example, cylindrical cavity 820 may be fitted with hollow metal cylinder 818. Cylindrical cavities align with mounting points on mounting plate 108 (e.g., through-holes 202 in FIG. 2). In one example, fasteners (e.g., bolts) may be inserted through cylindrical cavities for mounting the assembly to a housing of an inverter. When joined with mounting plate 108, plastic spring bracket 810 distributes compressive force across upper cooling plate 102, lower cooling plate 104, and electronic module captured therebetween. In one example, compressive force may be exerted where compression fingers 802 touch the upper cooling plate 102.

FIG. 9 shows a perspective view of a power electronics cooling assembly or assembly 900. Assembly 900 may be the same or similar to assembly 800 of FIG. 8. Components of assembly 900 that are identical to components of assembly 800 are numbered the same and will not be introduced.

Assembly 900 is substantially flat and symmetrical along longitudinal line of symmetry 924 and lateral line of symmetry 922 drawn on an xz plane, indicated by axis system 150. In one example, the assembly is I-shaped including a lateral width 910 across central bar 804 that is narrower than a lateral width 908 across first end 806 and longitudinal length 920 approximately 2.5 times the lateral width 910 of the central bar 804.

Plastic spring bracket 810 includes first planar region 926 opposite the longitudinal line of symmetry 924 from a second planar region 927 in first end 806. First cylindrical projection 812 projects from an underside (814 in FIG. 8) of the first planar region 926. Second cylindrical projection 813 projects from an underside of the second planar region 927. An opening on the upper surface 928 of first planar region 926 includes hollow metal cylinder 818 inside cylindrical cavity 820. The plurality of cylindrical projections of plastic spring bracket 810 are configured similarly and the configuration of second end 808 mirrors the first end 806. The central bar 804 includes molded longitudinal ridges 902 intersecting at approximately 90 degree angles with molded lateral ridges 904 to form boxes 906 in a grid-like arrangement. The grid formed into the central bar 804 extends the length of plastic spring bracket 810 from the first end 806 to the second end 808. The boxes 906 include longitudinal walls 914 formed by the molded longitudinal ridges 902 and lateral walls 916 formed by molded lateral ridges 904. Flexible appendage 918 projects from the base of lateral walls 916. The underside of the flexible appendage 918 includes compression fingers (802 in FIG. 2) that flexibly compress when plastic spring bracket 810 is assembled in a system such as assembly 900.

FIG. 10 shows a perspective view of a power electronics cooling assembly or assembly 1000. As one example, assembly 1000 may include a mounting bracket having mounting points for attachment to an inverter housing. A mounting bracket may provide compression and capability for mounting the assembly to an inverter in the event an electronics cooler does not incorporate mounting into its design such as an electronics cooler without a mounting plate.

Assembly 1000 may be described as substantially flat and symmetrical along longitudinal line of symmetry 1014 and lateral line of symmetry 1016 drawn on an xz plane, indicated by axis system 150. Assembly 1000 includes upper cooling plate 1002 arranged parallel in the xz plane with a lower cooling plate 1004, and a space 1006 disposed between the upper and lower cooling plates for an electronic module (e.g., 106 in FIG. 1). Assembly 1000 includes mounting bracket 1010 comprising bracket upper plate 1012 and bracket lower plate 1008. Assembled in a system, bracket upper plate 1012 may be affixed over the top of upper cooling plate 1002 and joined with bracket lower plate 1008 compressing the upper cooling plate, lower cooling plate 1004 and electronic module captured therebetween.

Upper cooling plate 1002 and lower cooling plate 1004 are substantially stadium shaped including parallel sides 1089, 1091 of length 1083 capped by semi-circular ends 1098, 1099 of radius 1085. The shape of mounting bracket 1010 is substantially similar to the shape of the upper and lower cooling plates 1002, 1004. First and second fittings 1026, 1027 may be brazed to the upper and lower cooling plates 1002, 1004. In one example, first and second fittings 1026, 1027 may couple interior channels of the upper and lower cooling plates 1002, 1004 to a coolant reservoir.

In one example, bracket upper plate 1012 may be formed from single, molded piece of plastic. Bracket upper plate 1012 may be described as substantially flat in the xz plane. Bracket upper plate 1012 includes a central bar 1018, first end 1020, and second end 1022. First end 1020 and second end 1022 are located on opposite ends of central bar 1018. Bracket upper plate 1012 is symmetric across longitudinal line of symmetry 1014 and lateral line of symmetry 1016. For example, components of bracket upper plate 1012 described with respect to the left side of lateral line of symmetry 1016 may be mirrored on the right side of lateral line of symmetry 1016. First end 1020 includes circular depression 1017 including a planar surface 1019 and a raised rim 1024. A plurality of clip receptacles are molded into bracket upper plate 1012. The clip receptacles project outward in the xz plane from raised rim 1024. A first clip receptacle 1021 is bisected by the longitudinal line of symmetry 1014. A second clip receptacle 1005 is opposite the longitudinal line of symmetry 1014 from a third clip receptacle 1007. The form of first clip receptacle 1021 includes four walls 1015 with a central recess 1009. The other clip receptacles of bracket upper plate 1012 are configured similarly. The central bar 1018 includes a plurality of molded longitudinal ridges intersecting at approximately 90 degree angles with molded lateral ridges such to form boxes in a grid-like arrangement. As one example, first longitudinal ridge 1028 intersects with first lateral ridge 1030 to form box 1034. The grid formed into the central bar 1018 extends the length of the central bar 1018 from first lateral ridge 1030 adjacent to the first end 1020 to the last lateral ridge 1036 adjacent to the second end 1022. The boxes, such as box 1034, include longitudinal walls 1032 formed by the molded longitudinal ridges and lateral walls 1033 formed by molded lateral ridges. A flexible appendage 1035 projects from the base of lateral walls 1033. The underside of the flexible appendage 1035 may include compression features, such as compression fingers 1096 illustrated with respect to bracket lower plate 1008, that provide compression when mounting bracket 1010 is assembled in a system such as assembly 1000. As another example, compression features may include dimples or ribs. Compression features may have their dimensions tuned to specific applications to control force distribution.

In one example, bracket lower plate 1008 may be formed from single, molded piece of plastic. Bracket lower plate 1008 has a similar shape as bracket upper plate 1012, the two plates of the mounting bracket 1010 having mating components. Bracket lower plate 1008 includes a central bar 1038, first end 1040, and second end 1042. First end 1040 and second end 1042 are located on opposite ends of central bar 1038. Bracket lower plate 1008 is symmetric across longitudinal line of symmetry 1014 and lateral line of symmetry 1016. For example, components of bracket lower plate 1008 described with respect to the left side of lateral line of symmetry 1016 may be mirrored on the right side of lateral line of symmetry 1016. First end 1040 includes circular recess 1044, defined by an opening on an exterior-facing surface (not shown) of bracket lower plate 1008, an opening on an interior-facing surface 1046, and an inner cylindrical surface 1048. Circular recess 1044 includes a lip 1050. In one example, when mounting bracket 1010 is assembled in a system, circular recesses in the first end 1040 and second end 1042 enable access to first and second fittings 1026, 1027 such as for coupling coolant passages of the upper cooling plate 1002 and lower cooling plate 1004 to a coolant reservoir.

In one example, a plurality of clips are molded into bracket lower plate 1008. The clips project upward in the xy plane from a periphery 1056 of the interior-facing surface 1046. In one example, the clips may be paired. For example, a first pair 1052 of paired clips, first clip 1058 and second clip 1060, is bisected by the longitudinal line of symmetry 1014. A second pair 1039 of paired clips is opposite the longitudinal line of symmetry 1014 from a third pair of clips (not shown). The form of first pair 1052 of clips includes first clip 1058 and second clip 1060. First clip 1058 includes a first surface 1064 parallel with a second surface 1066 (shown on second clip 1060) and third surface 1068 parallel with a fourth surface 1070 (shown on third clip 1072). The clips are relatively planar with first and second surfaces 1064, 1066 wider than the third and fourth surfaces 1068, 1070. First clip 1058 includes first hook 1062 and second clip 1060 includes second hook 1074. First clip 1058 and second clip 1060 may bias laterally, as indicated by arrow 1076. The other paired clips of bracket lower plate 1008 are configured similarly.

Similar to bracket upper plate 1012, the central bar 1038 of bracket lower plate 1008 includes a plurality of molded longitudinal ridges intersecting at approximately 90 degree angles with molded lateral ridges such to form a plurality of boxes in a grid-like arrangement. As one example, first longitudinal ridge 1078 intersects with first lateral ridge 1080 to form box 1082. The boxes such as box 1082 include longitudinal walls 1084 formed by the molded longitudinal ridges and lateral walls 1086 formed by molded lateral ridges. The grid includes a plurality of flexible appendages 1088, the appendages projecting from the base of a lateral wall (e.g., 1086) and each including one of compression fingers 1096. The grid formed into the central bar 1038 extends the length of the central bar in parallel with the grid formed in the bracket upper plate 1012.

Bracket lower plate 1008 includes a plurality of mounting points 1090 including a molded cylinder 1092 having a through-hole. In one example, the molded cylinder 1092 may be fitted with a hollow metal cylinder 1094. Four mounting points are shown in the example embodiment in FIG. 10. On first end 1040, a pair of mounting points 1090 project upwards along the y-axis from periphery 1056 on opposite sides of circular recess 1044. A second pair of mounting points 1090 may be located on the second end 1042 mirroring the configuration of the first pair. In one example, mounting points 1090 may align with mounting points on a housing of an inverter. In one example, the hollow metal cylinder 1094 may be threaded for fasteners such as screws or bolts.

In one example, assembly 1000 may be assembled by joining bracket upper plate 1012 with bracket lower plate 1008 to compressingly sandwich the upper cooling plate 1002, lower cooling plate 1004, and an electronic module (e.g., 106 in FIG. 1). Paired clips compress laterally to slide through the central recess of the clip receptacle and expand laterally to secure the bracket upper plate 1012 to bracket lower plate 1008 over the captured cooling plates and electronic module. For example, first pair 1052 of paired clips compress along arrow 1076 to slide through central recess 1009. Once through central recess, first pair 1052 of paired clips expands along arrow 1076, securing first hook 1062, and second hook 1074 over the lip 1013 of first clip receptacle 1021. When joined, bracket upper plate 1012 and bracket lower plate 1008 form mounting bracket 1010. In one example, compressive force may be exerted where compression fingers 1096 on the bracket lower plate 1008 touch the lower cooling plate 1004 and fingers (not shown) on the bracket upper plate 1012 touch the upper cooling plate 1002. In one example, fasteners (e.g., screws, bolts) may be inserted through hollow metal cylinder 1094 for joining assembly 1000 to an inverter housing.

FIG. 11 shows a perspective view of a power electronics cooling assembly or assembly 1100. Assembly 1100 may be configured for single-sided cooling applications including only a first cooling plate, shown in the example as upper cooling plate 1102, and an electronic module 1106 captured between the upper cooling plate and bracket lower plate 1108 of mounting bracket 1110. By way of example, assembly 1100 is shown including a mounting bracket 1110 for single-sided cooling compression. However, it may be understood that single-sided cooling may be achieved with other assembly configurations, such as those shown with respect to FIGS. 1-9. For example, single-sided cooling may achieved in the example assembly configurations disclosed herein by excluding a second cooling plate and compressing the electronic module between only the first cooling plate and the mounting plate. As another example, the electronic module may be positioned above the first cooling plate, with one of a mounting bracket and a spring bracket applying compressive force on the electronic module directly.

Assembly 1100 may be described as substantially flat and symmetrical along longitudinal line of symmetry 1114 and lateral line of symmetry 1116 drawn on an xz plane, indicated by axis system 150. Assembly 1100 includes upper cooling plate 1102 arranged above electronic module 1106. Assembly 1100 further includes mounting bracket 1110 comprising bracket upper plate 1112 and bracket lower plate 1008. Assembled in a system, bracket upper plate 1012 may be affixed over the top of upper cooling plate 1002 and joined with bracket lower plate 1008 compressing the electronic module 1106 captured therebetween.

Similar to assembly 1000, the upper cooling plate 1102 of assembly 1100 is substantially stadium shaped including parallel sides 1191, 1193 capped by semi-circular ends 1198, 1199. The shape of mounting bracket 1110 may be similar to the shape of the upper cooling plate 1102 (e.g., stadium shaped). First and second fittings 1126, 1127 may be brazed to the upper cooling plate 1102 and the fittings may fluidically couple interior channels of the upper cooling plate to a coolant reservoir.

In one example, bracket upper plate 1112 may be formed from single, molded piece of plastic. Bracket upper plate 1112 may be described as substantially flat in the xz plane. Bracket upper plate 1112 includes a central bar 1118, first end 1120, and second end 1122. First end 1120 and second end 1122 are located on opposite ends of central bar 1118. Bracket upper plate 1112 is symmetric across longitudinal line of symmetry 1114 and lateral line of symmetry 1116. For example, components of bracket upper plate 1112 described with respect to the left side of lateral line of symmetry 1116 may be mirrored on the right side of lateral line of symmetry 1116. First end 1120 includes circular depression 1117 including a planar surface 1119 and a raised rim 1124. A plurality of clip receptacles are molded into bracket upper plate 1112. The clip receptacles project outward in the xz plane from raised rim 1124. A first clip receptacle 1121 is bisected by the longitudinal line of symmetry 1114. A second clip receptacle 1105 is opposite the longitudinal line of symmetry 1114 from a third clip receptacle 1107. The form of first clip receptacle 1121 includes four walls 1115 with a central recess 1109. The other clip receptacles of bracket upper plate 1112 are configured similarly. The central bar 1118 includes a plurality of molded longitudinal ridges intersecting at approximately 90 degree angles with molded lateral ridges such to form boxes in a grid-like arrangement. As one example, first longitudinal ridge 1128 intersects with first lateral ridge 1130 to form box 1134. The grid formed into the central bar 1118 extends the length of the central bar 1118 from first lateral ridge 1130 adjacent to the first end 1120 to the last lateral ridge 1136 adjacent to the second end 1122. The boxes, such as box 1134, include longitudinal walls 1132 formed by the molded longitudinal ridges and lateral walls 1133 formed by molded lateral ridges. A flexible appendage 1135 projects from the base of lateral walls 1133. The underside of the flexible appendage 1135 may include compression features, such as compression fingers 1196 illustrated with respect to bracket lower plate 1108, that provide compression when mounting bracket 1110 is assembled in a system such as assembly 1100.

In one example, bracket lower plate 1108 may be formed from single, molded piece of plastic. Bracket lower plate 1108 has a similar shape as bracket upper plate 1112, the two plates of the mounting bracket 1110 having mating components. Bracket lower plate 1108 includes a central bar 1138, first end 1140, and second end 1142. First end 1140 and second end 1142 are located on opposite ends of central bar 1138. Bracket lower plate 1108 is symmetric across longitudinal line of symmetry 1114 and lateral line of symmetry 1116. For example, components of bracket lower plate 1108 described with respect to the left side of lateral line of symmetry 1116 may be mirrored on the right side of lateral line of symmetry 1116. First end 1140 includes circular recess 1144, defined by an opening on an exterior-facing surface (not shown) of bracket lower plate 1108, an opening on an interior-facing surface 1146, and an inner cylindrical surface 1148. Circular recess 1144 includes a lip 1150. In one example, when mounting bracket 1110 is assembled in a system, circular recesses in the first end 1140 and second end 1142 enable access to first and second fittings 1126, 1127 such as for fluidically coupling coolant passages of the upper cooling plate 1102 to a coolant reservoir.

In one example, a plurality of clips are molded into bracket lower plate 1108. The clips project upward in the xy plane from a periphery 1156 of the interior-facing surface 1146. In one example, the clips may be paired. For example, first end 1140 includes first pair of paired clips 1152. The first pair of paired clips 1152 are bisected by the longitudinal line of symmetry 1114. A second pair of paired clips 1158 is opposite the longitudinal line of symmetry 1114 from a third pair of clips 1160. The paired clips described with respect to assembly 1100 may be formed the same or similar to the paired clips described with respect to assembly 1000 in FIG. 10 (e.g., first clip 1058, second clip 1060), for example having hooks 1162 projecting an upper edge 1168. The first pair of paired clips 1152 may bias laterally, as indicated by arrow 1176. The second end 1142 of bracket lower plate 1108 includes paired clips that may be configured similarly.

Similar to bracket upper plate 1112, the central bar 1138 of bracket lower plate 1108 includes a plurality of molded longitudinal ridges intersecting at approximately 90 degree angles with molded lateral ridges such to form a plurality of boxes in a grid-like arrangement. As one example, first longitudinal ridge 1178 intersects with first lateral ridge 1180 to form box 1182. The boxes such as box 1182 include longitudinal walls 1184 formed by the molded longitudinal ridges and lateral walls 1186 formed by molded lateral ridges. The grid includes a plurality of flexible appendages 1188, the appendages projecting from the base of a lateral wall (e.g., 1186) and each including one of compression fingers 1196. The grid formed into the central bar 1138 extends the length of the central bar in parallel with the grid formed in the bracket upper plate 1112.

Bracket lower plate 1108 includes a plurality of mounting points 1090 including a molded cylinder 1192 having a through-hole. In one example, the molded cylinder 1192 may be fitted with a hollow metal cylinder 1194. Four mounting points are shown in the example in FIG. 11. On first end 1140, a pair of mounting points 1190 project upwards along the y-axis from periphery 1156 on opposite sides of circular recess 1144. A second pair of mounting points may be located on the second end 1142 mirroring the configuration of the first pair. In one example, mounting points 1190 may align with mounting points on a housing of an inverter. In one example, the hollow metal cylinder 1194 may be threaded for fasteners such as screws or bolts.

In one example, assembly 1100 may be assembled by joining bracket upper plate 1112 with bracket lower plate 1008 to compress the upper cooling plate and an electronic module 1106. Module clips 1111 may project upwards from the periphery 1156 to laterally secure (e.g., mount) the electronic module 1106 to the bracket lower plate 1108. Paired clips compress laterally to slide through the central recess of the clip receptacle and expand laterally to secure the bracket upper plate 1112 to bracket lower plate 1108 over the captured cooling plates and electronic module. For example, first pair of paired clips 1152 compress along arrow 1176 to slide through central recess 1109. Once through central recess, first pair of paired clips 1152 expands along arrow 1176, securing hooks 1162 over the lip 1113 of first clip receptacle 1121. When joined, bracket upper plate 1112 and bracket lower plate 1108 form mounting bracket 1110. In one example, compressive force may be exerted where compression fingers 1196 on the bracket lower plate 1108 touch the electronic module 1106 and compression fingers (not shown) on the bracket upper plate 1112 touch the upper cooling plate 1102. In one example, fasteners (e.g., screws, bolts) may be inserted through hollow metal cylinder 1194 for joining assembly 1100 to an inverter housing.

In this way, compression of a power electronics cooling assembly and less application specific mounting are achieved. The technical effect the power electronics cooling assembly is increased cooling of power-dense, high-heat producing electronics.

The disclosure also provides support for a power electronics cooling assembly comprising: a first cooling plate, a mounting plate, the mounting plate having mounting points to be attached to a housing, an electronic module disposed between the first cooling plate and the mounting plate, and a spring bracket applying force towards the first cooling plate, the spring bracket having mounting points aligned with the mounting points of the mounting plate. In a first example of the system, the spring bracket is affixed over the first cooling plate and secured to the mounting plate via the mounting points aligned with the mounting points of the mounting plate. In a second example of the system, optionally including the first example, the spring bracket comprises an I-shaped bar having a first end region and an opposing, second end region. In a third example of the system, optionally including one or both of the first and second examples, the spring bracket further comprises a plurality of arms, the arms having a first segment bending approximately perpendicular to the I-shaped bar and a second segment bending approximately parallel to the mounting plate, the second segment having a through-hole aligned with the mounting points of the mounting plate. In a fourth example of the system, optionally including one or more or each of the first through third examples, the spring bracket bends convexly towards the first cooling plate. In a fifth example of the system, optionally including one or more or each of the first through fourth examples, the spring bracket comprises a central opening, the central opening having a circumferential rib. In a sixth example of the system, optionally including one or more or each of the first through fifth examples, the spring bracket comprises two or more ribs. In a seventh example of the system, optionally including one or more or each of the first through sixth examples, the spring bracket is stiff, substantially flat, and attached by springs to the mounting plate. In an eighth example of the system, optionally including one or more or each of the first through seventh examples, the first cooling plate includes brazed locating features for indicating spring bracket placement. In a ninth example of the system, optionally including one or more or each of the first through eighth examples, the spring bracket comprises a plurality of cylindrical projections, the cylindrical projections being oriented perpendicular to the I-shaped bar and having a cylindrical cavity aligned with the mounting points of the mounting plate. In a tenth example of the system, optionally including one or more or each of the first through ninth examples, the spring bracket comprises a plurality of flexible appendages in contact with the first cooling plate. In a eleventh example of the system, optionally including one or more or each of the first through tenth examples, the system further comprises: a second cooling plate, the second cooling plate positioned adjacent to an upper surface of the mounting plate and arranged in parallel with the first cooling plate, wherein the electronic module is compressed between the first cooling plate and the second cooling plate. In a twelfth example of the system, optionally including one or more or each of the first through eleventh examples, the first cooling plate, and the second cooling plate are fluidically coupled.

The disclosure also provides support for a system, comprising: a power electronics cooling assembly including a first cooling plate, a mounting plate, an electronic module disposed between the first cooling plate and the mounting plate, the mounting plate comprising mounting points to be attached to a housing, and at least one or more of the following: a spring bracket bending convexly towards the first cooling plate, the spring bracket comprising mounting points aligned with the mounting points of the mounting plate, a stiff bar in contact with the first cooling plate, the stiff bar comprising mounting points aligned with the mounting points of the mounting plate, and the stiff bar being attached by springs to the mounting plate, and a plastic spring bracket, the plastic spring bracket comprising mounting points aligned with the mounting points of the mounting plate, and the plastic spring bracket further comprising a plurality of flexible appendages in contact with the first cooling plate. In a first example of the system, the system further comprises: a second cooling plate, the second cooling plate positioned adjacent to an upper surface of the mounting plate and arranged in parallel with the first cooling plate, and wherein the electronic module is compressed between the first cooling plate and the second cooling plate. In a second example of the system, optionally including the first example, the power electronics cooling assembly is substantially flat and I-shaped.

The disclosure also provides support for a power electronics cooling assembly comprising: an upper cooling plate, a lower cooling plate, an electronic module disposed between the upper cooling plate and lower cooling plate, a mounting plate being in contact with the lower cooling plate, the mounting plate having mounting points to be attached to a housing, and at least one of the following: a spring bracket bending convexly towards the upper cooling plate, the spring bracket having mounting points aligned with the mounting points of the mounting plate, a bar in contact with the upper cooling plate, the bar having mounting points aligned with the mounting points of the mounting plate, and the bar being attached by springs to the mounting plate, and a plastic spring bracket having a plurality of flexible appendages in contact with the upper cooling plate, the plastic spring bracket having mounting points aligned with the mounting points of the mounting plate. In a first example of the system, one of the spring bracket, the bar, and the plastic spring bracket is affixed over the upper cooling plate and secured to the mounting plate via the mounting points aligned with the mounting points of the mounting plate. In a second example of the system, optionally including the first example, the upper cooling plate and the lower cooling plate are fluidic ally coupled.

The disclosure also provides support for a power electronics cooling assembly comprising: a first cooling plate, a mounting bracket including a bracket upper plate and a bracket lower plate, the bracket upper plate applying force towards the first cooling plate and the bracket lower plate having mounting points to be attached to a housing, and an electronic module disposed between the first cooling plate and the bracket lower plate, wherein the bracket upper plate includes a plurality of clip receptacles and is affixed over the first cooling plate and secured to the bracket lower plate via a plurality of clips aligned with the clip receptacles, and wherein the bracket upper plate includes a plurality of flexible appendages in contact with the first cooling plate, and the bracket lower plate includes a plurality of flexible appendages in contact with one of a second cooling plate and the electronic module.

FIGS. 1-11 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

It will be appreciated that the configurations and routines disclosed herein are exemplary in nature, and that these specific embodiments are not to be considered in a limiting sense, because numerous variations are possible. Moreover, unless explicitly stated to the contrary, the terms "first," "second," "third," and the like are not intended to denote any order, position, quantity, or importance, but rather are used merely as labels to distinguish one element from another. The subject matter of the present disclosure includes all novel and non-obvious combinations and sub-combinations of the various systems and configurations, and other features, functions, and/or properties disclosed herein.

As used herein, the term "approximately" is construed to mean plus or minus five percent of the range unless otherwise specified, and the term "substantially parallel" means that the elements are sufficiently parallel to be considered parallel to one of ordinary skill in the art without being perfectly parallel. The term "substantially flat" means that the elements are sufficiently flat to be considered flat to one of ordinary skill in the art without being perfectly flat. The term "substantially symmetrical" means that the elements are sufficiently symmetrical to be considered symmetrical to one of ordinary skill in the art without being perfectly symmetrical. The term "substantially I-shaped" means that the elements are sufficiently I-shaped to be considered I-shaped to one of ordinary skill in the art without being perfectly I-shaped. The term "substantially rectangular" means that the elements are sufficiently rectangular to be considered rectangular to one of ordinary skill in the art without being perfectly I-shaped. The term "substantially stadium shaped" means that the elements are sufficiently stadium shaped to be considered stadium shaped to one of ordinary skill in the art without being perfectly I-shaped.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A power electronics cooling assembly, comprising:
a first cooling plate;
a mounting plate, the mounting plate having mounting points to be attached to a housing;
an electronic module disposed between the first cooling plate and the mounting plate; and a spring bracket applying force towards the first cooling plate, the spring bracket having mounting points aligned with the mounting points of the mounting plate, wherein the spring bracket comprises a plurality of flexible appendages in contact with the first cooling plate, wherein the plurality of flexible appendages is arranged in multiple rows, and wherein the multiple rows are spaced apart from each other along a length of the spring bracket, wherein each of the multiple rows comprises multiple flexible appendages of the plurality of flexible appendages, spaced apart along a width of the spring bracket, and wherein each of the plurality of flexible appendages are in boxes recessed relative to a top surface of the spring bracket.

2. The power electronics cooling assembly of claim 1, wherein the spring bracket is affixed over the first cooling plate and secured to the mounting plate via the mounting points aligned with the mounting points of the mounting plate, and wherein the plurality of flexible appendages extend in a direction towards the first cooling plate.

3. The power electronics cooling assembly of claim 1, wherein the spring bracket comprises an I-shaped bar having a first end region and an opposing, second end region.

4. The power electronics cooling assembly of claim 3, wherein the spring bracket comprises a plurality of cylindrical projections, the cylindrical projections being oriented perpendicular to the I-shaped bar and having a cylindrical cavity aligned with the mounting points of the mounting plate.

5. The power electronics cooling assembly of claim 1, further comprising a second cooling plate, the second cooling plate positioned adjacent to an upper surface of the mounting plate and arranged in parallel with the first cooling plate, wherein the electronic module is compressed between the first cooling plate and the second cooling plate.

6. The power electronics cooling assembly of claim 5, wherein the first cooling plate and the second cooling plate are fluidically coupled.

7. The power electronics cooling assembly of claim 1, wherein the spring bracket comprises a central bar, wherein the central bar extends between cylindrical projections formed at opposing ends of the spring bracket, and wherein the central bar is planar.

8. The power electronics cooling assembly of claim 7, wherein the plurality of flexible appendages are molded into the central bar in a grid-like arrangement.

9. The power electronics cooling assembly of claim 1, wherein each of the plurality of flexible appendages further includes a compression finger at an underside of the plurality of flexible appendages.

10. The power electronics cooling assembly of claim 1, wherein the box for each of the plurality of flexible appendages is open at the top surface of the spring bracket.

11. The power electronics cooling assembly of claim 1, wherein the plurality of flexible appendages span across a majority of both a length of the spring bracket and a width of the spring bracket.

12. A system, comprising:
a power electronics cooling assembly including a first cooling plate, a mounting plate, an electronic module disposed between the first cooling plate and the mounting plate, the mounting plate comprising mounting points to be attached to a housing, and at least one or more of the following:

a spring bracket bending convexly towards the first cooling plate, the spring bracket comprising mounting points aligned with the mounting points of the mounting plate;

a stiff bar in contact with the first cooling plate, the stiff bar comprising mounting points aligned with the mounting points of the mounting plate, and the stiff bar being attached by springs to the mounting plate; and a plastic spring bracket, the plastic spring bracket comprising mounting points aligned with the mounting points of the mounting plate, and the plastic spring bracket further comprising a plurality of flexible appendages in contact with the first cooling plate, wherein the plurality of flexible appendages is arranged in multiple rows, and wherein the multiple rows are spaced apart from each other along a length of the plastic spring bracket, wherein each of the multiple rows comprises multiple flexible appendages of the plurality of flexible appendages, spaced apart along a width of the plastic spring bracket, and wherein the plurality of flexible appendages are arranged in a grid-like arrangement such that each of the plurality of flexible appendages are configured in separate boxes formed by longitudinal ridges.

13. The system of claim 12, further comprising a second cooling plate, the second cooling plate positioned adjacent to an upper surface of the mounting plate and arranged in parallel with the first cooling plate, and wherein the electronic module is compressed between the first cooling plate and the second cooling plate.

14. The system of claim 12, wherein the power electronics cooling assembly is substantially flat and I-shaped, and wherein the longitudinal ridges are molded into the plastic spring bracket.

15. A power electronics cooling assembly, comprising:
an upper cooling plate,
a lower cooling plate,
an electronic module disposed between the upper cooling plate and lower cooling plate, and
a mounting plate being in contact with the lower cooling plate, the mounting plate having mounting points to be attached to a housing, and at least one of the following:

a spring bracket bending convexly towards the upper cooling plate, the spring bracket having mounting points aligned with the mounting points of the mounting plate;

a bar in contact with the upper cooling plate, the bar having mounting points aligned with the mounting points of the mounting plate, and the bar being attached by springs to the mounting plate; and a plastic spring bracket having a plurality of flexible appendages in contact with the upper cooling plate, the plastic spring bracket having mounting points aligned with the mounting points of the mounting plate, wherein the plurality of flexible appendages is arranged in multiple rows, and wherein the multiple rows are spaced apart from each other along a length of the plastic spring bracket, wherein each of the multiple rows comprises multiple flexible appendages of the plurality of flexible appendages, spaced apart along a width of the plastic spring bracket, wherein each of the plurality of flexible appendages are recessed relative to a top surface of the plastic spring bracket, and wherein the plurality of flexible appendages are arranged in a grid-like arrangement such that each of the plurality of flexible appendages are configured in separate boxes formed by longitudinal ridges.

16. The power electronics cooling assembly of claim 15, wherein one of the spring bracket, the bar, and the plastic spring bracket is affixed over the upper cooling plate and secured to the mounting plate via the mounting points aligned with the mounting points of the mounting plate.

17. The power electronics cooling assembly of claim 15, wherein the upper cooling plate and the lower cooling plate are fluidically coupled.

* * * * *